(12) United States Patent
Wang et al.

(10) Patent No.: US 11,862,528 B2
(45) Date of Patent: Jan. 2, 2024

(54) METHOD FOR FORMING SEMICONDUCTOR PACKAGE

(71) Applicant: Taiwan Semiconductor Manufacturing Company, Ltd., Hsinchu (TW)

(72) Inventors: Chin-Hua Wang, New Taipei (TW); Po-Yao Lin, Zhudong Township, Hsinchu County (TW); Feng-Cheng Hsu, New Taipei (TW); Shin-Puu Jeng, Hsinchu (TW); Wen-Yi Lin, New Taipei (TW); Shu-Shen Yeh, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 112 days.

(21) Appl. No.: 17/320,981

(22) Filed: May 14, 2021

(65) Prior Publication Data

US 2021/0272869 A1  Sep. 2, 2021

Related U.S. Application Data

(62) Division of application No. 16/275,518, filed on Feb. 14, 2019, now Pat. No. 11,011,447.

(Continued)

(51) Int. Cl.
*H01L 23/00* (2006.01)
*H01L 23/367* (2006.01)
(Continued)

(52) U.S. Cl.
CPC ........ *H01L 23/367* (2013.01); *H01L 21/4882* (2013.01); *H01L 21/563* (2013.01);
(Continued)

(58) Field of Classification Search
CPC ......... H01L 23/00; H01L 23/31; H01L 23/42; H01L 23/433; H01L 23/367; H01L 23/373; H01L 23/498; H01L 23/538; H01L 23/562; H01L 23/3736; H01L 23/3128; H01L 23/3672; H01L 23/3737; H01L 23/5384; H01L 23/49822; H01L 23/49827; H01L 23/49811; H01L 21/48; H01L 21/56; H01L 21/4882; H01L 21/563; H01L 24/02;
(Continued)

(56) References Cited

U.S. PATENT DOCUMENTS 6,919,631 B1  7/2005  Zoba
2004/0125564 A1*  7/2004  DiStefano ............... H01L 24/32
257/E21.503

(Continued)

*Primary Examiner* — Chuong A Luu
(74) *Attorney, Agent, or Firm* — McClure, Qualey & Rodack, LLP

(57) ABSTRACT

A method of forming a semiconductor package is provided. The method includes mounting a chip on a package substrate. The method further includes placing a heat spreader over the chip and applying a thermal interface material to a first surface of the heat spreader facing the chip. The heat spreader is flexible. In addition, the method includes attaching the heat spreader to the chip through the thermal interface material by rolling a rod over a second surface of the heat spreader, and the second surface is opposite to the first surface.

20 Claims, 29 Drawing Sheets

Related U.S. Application Data

(60) Provisional application No. 62/718,545, filed on Aug. 14, 2018.

(51) Int. Cl.
  *H01L 25/065* (2023.01)
  *H01L 23/373* (2006.01)
  *H01L 23/31* (2006.01)
  *H01L 25/10* (2006.01)
  *H01L 21/48* (2006.01)
  *H01L 21/56* (2006.01)
  *H01L 23/433* (2006.01)

(52) U.S. Cl.
  CPC ...... *H01L 23/3128* (2013.01); *H01L 23/3736* (2013.01); *H01L 23/433* (2013.01); *H01L 25/0655* (2013.01); *H01L 25/105* (2013.01)

(58) Field of Classification Search
  CPC ......... H01L 24/11; H01L 24/13; H01L 24/81; H01L 24/73; H01L 24/32; H01L 24/92; H01L 24/29; H01L 25/00; H01L 25/50; H01L 25/10; H01L 25/105; H01L 25/065; H01L 25/0655; H01L 23/5383
  USPC ........................................................ 438/106
  See application file for complete search history.

(56) References Cited

U.S. PATENT DOCUMENTS

| | | | |
|---|---|---|---|
| 2007/0138621 A1* | 6/2007 | Sane | H01L 23/4275 257/704 |
| 2007/0212812 A1* | 9/2007 | Chow | H01L 21/6836 257/E23.09 |
| 2009/0045505 A1 | 2/2009 | Hsu | |
| 2012/0299173 A1 | 11/2012 | Mohammed et al. | |
| 2014/0217610 A1 | 8/2014 | Jeng et al. | |
| 2015/0130047 A1 | 5/2015 | Tseng et al. | |
| 2016/0005717 A1 | 1/2016 | Lin et al. | |
| 2018/0331011 A1* | 11/2018 | Rivera | H01L 23/562 |
| 2018/0374776 A1 | 12/2018 | Liu et al. | |

* cited by examiner

METHOD FOR FORMING SEMICONDUCTOR PACKAGE

CROSS REFERENCE TO RELATED APPLICATIONS

The present application is a divisional application of U.S. patent application Ser. No. 16/275,518, filed on Feb. 14, 2019, now U.S. Pat. No. 11,011,447, which claims priority of U.S. Provisional Patent Application No. 62/718,545, filed on Aug. 14, 2018, the entirety of which are incorporated by reference herein.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support higher circuit density. Furthermore, the demand for higher performance and reliability in devices results in the need for an improved semiconductor package having better thermal and mechanical performance.

Although existing semiconductor packages and methods for forming the same have been generally adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which:

FIG. 6O is a cross-sectional view of an intermediate stage in the fabrication of the semiconductor package in FIG. 5 in accordance with some embodiments.

DETAILED DESCRIPTION

Figure 1A:
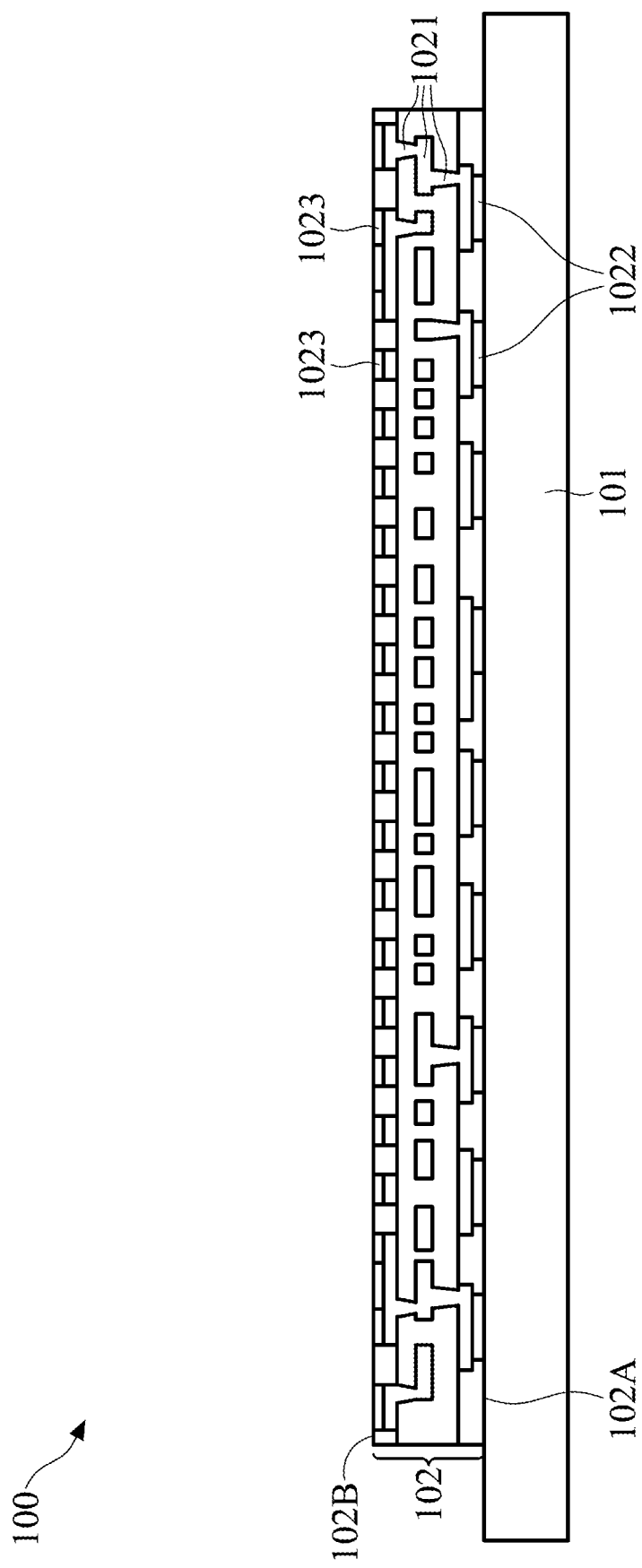
FIG. 1A is a cross-sectional view of an intermediate stage in the fabrication of a semiconductor package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to a semiconductor package including a heat spreader with high thermal conductivity and the method of forming the same. The intermediate stages of forming the semiconductor package are illustrated. Some variations of the embodiments are described. Throughout the various views and illustrative embodiments, like reference numbers are used to designate like elements.

FIGS. 1A-1G are cross-sectional views of a semiconductor package 100 (see FIG. 2A) at various stages of fabrication in accordance with some embodiments. It should be understood that FIGS. 1A-1G have been simplified for a better illustration of the concepts of the present disclosure. Moreover, the materials, geometries, dimensions, structures, and process parameters described herein are only illustrative, and are not intended to be, and should not be construed to be, limiting to the present disclosure. Many alternatives and modifications will be apparent to those skilled in the art, once informed by the present disclosure.

Referring to FIG. 1A, a carrier 101 is provided. The carrier 101 may be configured to provide structural rigidity or a base for deposition of subsequent material layers or films. The carrier 101 is a substrate carrier or a semiconductor wafer carrier (e.g., silicon wafer) in some embodiments. However, the carrier 101 may also be a glass carrier, a ceramic carrier, or the like.

A package substrate 102 is formed on the carrier 101. The package substrate 102 may include one or more dielectric layers. Conductive redistribution lines 1021 (e.g., metal lines) may be formed in or between the dielectric layers to electrically couple a number of conductive features 1022, 1023 (e.g., conductive pads) on opposite surfaces of the package substrate 102. For example, the package substrate 102 may be formed by depositing dielectric layers through a chemical vapor deposition (CVD), physical vapor deposition (PVD), atomic layer deposition (ALD), spin-on coating, lamination, or another suitable deposition process, depositing metal layers on or between the dielectric layers through any suitable deposition process described above, and patterning the metal layers to form the conductive redistribution lines 1021 and conductive features 1022, 1023 through a lithography process and an etching process (e.g., wet or dry etching process). In some embodiments, the dielectric layers comprise polymer, polyimide, silicon oxide, silicon nitride, or another suitable dielectric material. The metal layers comprise Cu, Pt, Ag, Ni, another suitable metal, alloys thereof, or a combination thereof.

As shown in FIG. 1A, the package substrate 102 has a first surface 102A (e.g., the bottom surface) attached to the carrier 101 and a second surface 102B (e.g., the top surface) opposite to the first surface 102A. The conductive features 1023 exposed to the second surface 102B are configured to be electrically connected to the chips 103 (see FIG. 1B), and the conductive features 1022 exposed to the first surface 102A are configured to be electrically connected to an external device (e.g., a printed circuit board (PCB) (not shown)). In some embodiments, the package substrate 102 also includes active and/or passive components (not shown).

Figure 1B:
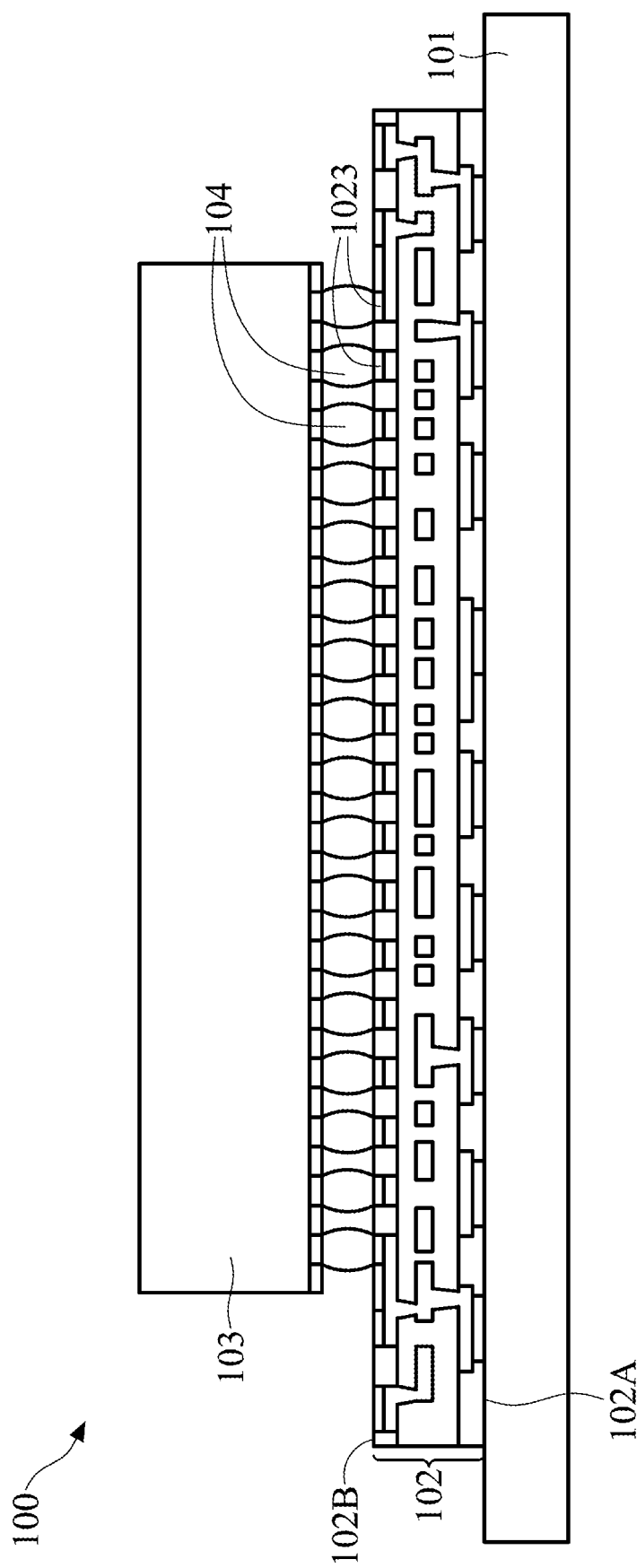
FIG. 1B is a cross-sectional view of an intermediate stage in the fabrication of a semiconductor package in accordance with some embodiments.

Referring to FIG. 1B, a number of chips 103 are mounted on the package substrate 102 (only one chip 103 is depicted for simplicity). The chips 103 may be mounted on the second surface 102B (the top surface) of the package substrate 102 (i.e., they may be electrically connected to the conductive features 1023) by electrical connectors 104, such as a ball grid array (BGA). In some embodiments, the electrical connectors 104 comprise lead-free solder or the like. A reflow process (not shown) may be performed to make the metallurgical connections in a chip-solder-chip carrier (i.e., the chip 103-the electrical connectors 104-the package substrate 102). The chips 103 may be any suitable integrated circuit (IC) chip or die for a particular application. For example, the chips 103 may be memory chips, logic chips, processor chips, or the like.

Figure 1C:
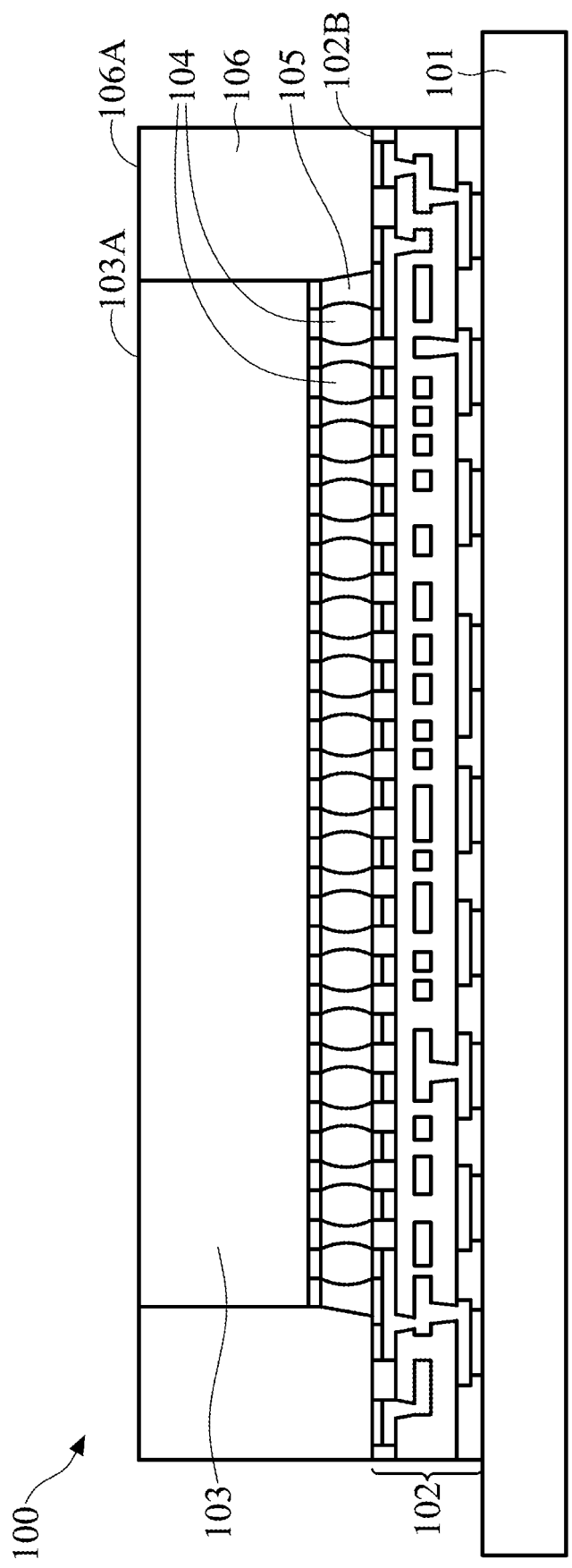
FIG. 1C is a cross-sectional view of an intermediate stage in the fabrication of a semiconductor package in accordance with some embodiments.
Figure 2A:
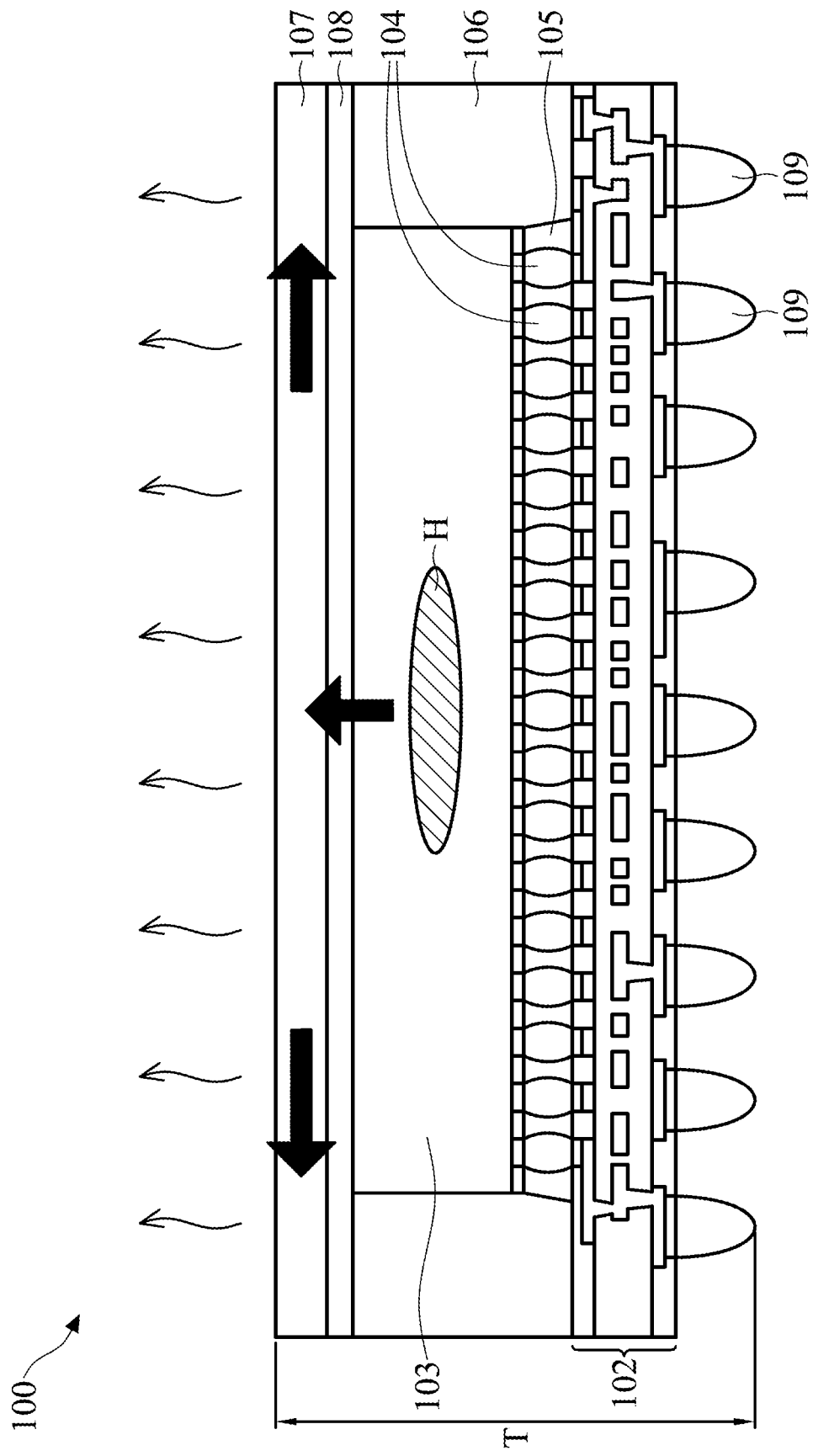
FIG. 2A is a cross-sectional view of a semiconductor package formed by the fabrication illustrated in FIGS. 1A-1G in accordance with some embodiments.

Referring to FIG. 1C, an underfill material 105 is dispensed (e.g., by a dispenser (not shown)) into the space between each chip 103 and the package substrate 102 and the space between adjacent electrical connectors 104, and then cured (e.g., ultraviolet (UV) or thermally cured) to harden. The underfill material 105 may be configured to provide a stronger mechanical connection and a heat bridge between the 103 chip and the package substrate 102, to reduce cracking in the electrical connectors 104 caused by thermal expansion mismatches between the chip 103 and the package substrate 102, and to protect the joints from contaminants, thereby improving reliability of the fabricated semiconductor package 100 (FIG. 2A). In some embodiments, the underfill material 105 comprises liquid epoxy, deformable gel, silicon rubber, or the like.

Afterwards, a molding compound 106 is formed over the package substrate 102 and encapsulates the side periphery of each chip 103. The molding compound 106 may be configured to provide package stiffness, a protective or hermetic shielding, and/or provide a heat conductive path to prevent chip overheating. The molding compound 106 may be formed by a spin-on coating process, an injection molding process, or the like. In some embodiments, the molding compound 106 comprises epoxy, epoxy with thermally conductive filler materials, plastic molding compound, or another suitable material.

In some embodiments, the molding compound 106 is formed in such a way that its top surface 106A is substantially level (coplanar) with the top surface 103A of chip 103 (i.e., the top surface 103A of chip 103 is exposed as shown in FIG. 1C). For example, the molding compound 106 may be formed to cover the top surface 103A of chip 103, and then planarized by a chemical mechanical polishing (CMP) process or another suitable grinding or etching process to remove a portion of the molding compound 106 to expose the top surface 103A of chip 103.

Figure 1D:
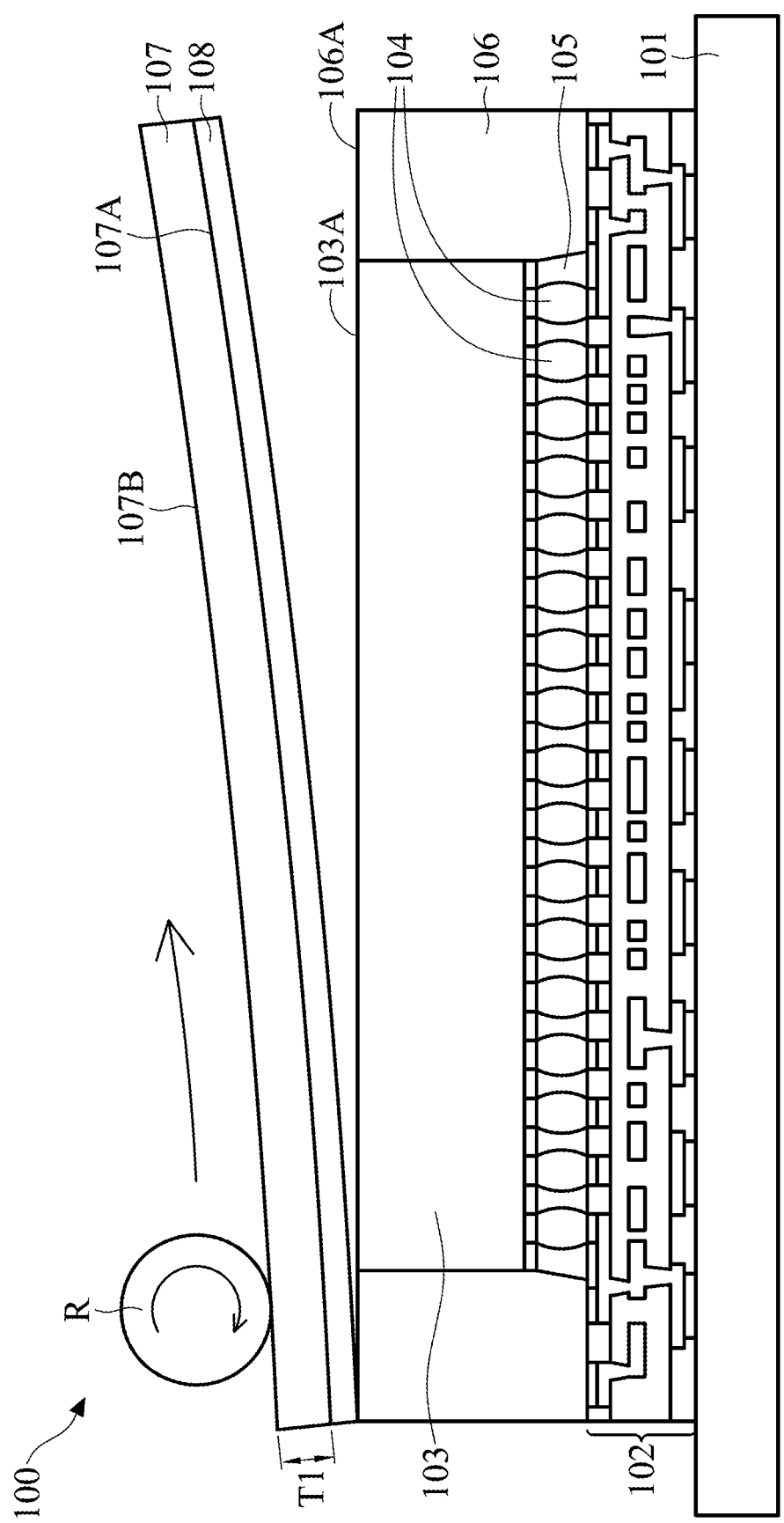
FIG. 1D is a cross-sectional view of an intermediate stage in the fabrication of a semiconductor package in accordance with some embodiments.

Referring to FIG. 1D, a heat spreader 107 and a thermal interface material (TIM) 108 are provided, and the thermal interface material 108 is dispensed (e.g., by a dispenser (not shown)) on the bottom surface 107A of the heat spreader 107. For example, the thermal interface material 108 may be dispensed on the heat spreader 107 when its bottom surface 107A faces upward, and then the heat spreader 107 with the thermal interface material 108 are flipped as shown in FIG. 1D.

The heat spreader 107 may have high thermal conductivity. Furthermore, the heat spreader 107 may be flexible. In some embodiments, the heat spreader 107 is a graphite sheet having a thermal conductivity between about 1000 W/m-K and 1800 W/m-K. Alternatively, the heat spreader 107 may be a graphite sheet with metal reinforcement (i.e., it may comprise a metal material such as copper, aluminum, or another suitable metal) so that the structural strength of heat spreader 107 is further improved to prevent it from crushing or cracking easily. It should be appreciated that a graphite sheet used as the heat spreader 107 may have a higher thermal conductivity than a typical metal heat spreader, and may be flexible in order to facilitate the subsequent attachment process. In some embodiments, the thickness T1 of the heat spreader 107 may be in a range between about 15 microns and about 70 microns to have a good flexibility. The shape and size (in a top view) of the heat spreader 107 may correspond to those of the package substrate 102.

The thermal interface material 108 may have a higher thermal conductivity than a typical adhesive material, however, the thermal conductivity of the thermal interface material 108 may still be much lower than that of the heat spreader 107. In some embodiments, the thermal interface material 108 has a thermal conductivity between about 3 W/m-K and 8 W/m-K, although its thermal conductivity may also be slightly higher or lower. The thermal interface material 108 may comprise an organic material, and it may also act as an adhesive. In some embodiments, the thermal interface material 108 comprises a polymer matrix, a phase change polymer, a silicone-based matrix, a matrix additive (fluxing agent), a filler material (a metallic core with an organic solderability preservative coating), or the like. The thermal interface material 108 may be dispensed in a liquid form that has a high viscosity.

After the thermal interface material 108 is applied to the bottom surface 107A of the heat spreader 107, the heat spreader 107 is attached to the chip 103 and the molding compound 106 by the thermal interface material 108. In the embodiments illustrated in FIG. 1D, after the heat spreader 107 with the thermal interface material 108 is placed over the chip 103 and molding compound 106, an attachment process is performed. The attachment process includes rolling a rod R over the top surface 107B of the heat spreader 107 (e.g., from one side (such as the left side in the figure) of the heat spreader 107 to the opposite side (such as the right side in the figure) thereof) to attach the heat spreader 107 to the chip 103 and molding compound 106 through the thermal interface material 108. By doing it this way, the flexible heat spreader 107 can be easily and smoothly attached to the top surface 103A of the chip 103 and the top surface 106A of the molding compound 106.

Figure 1E:
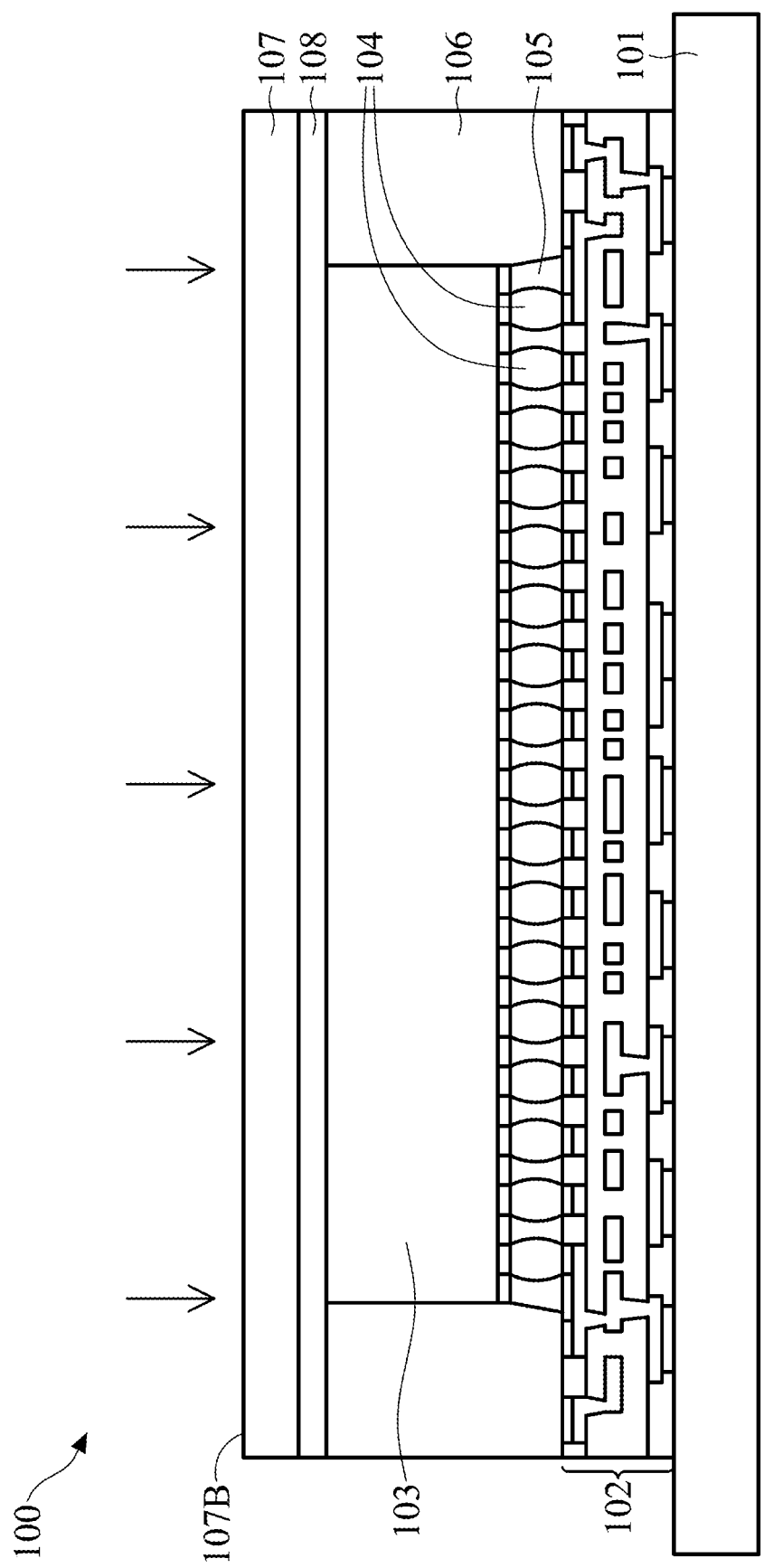
FIG. 1E is a cross-sectional view of an intermediate stage in the fabrication of a semiconductor package in accordance with some embodiments.

Referring to FIG. 1E, a compression process is performed (as indicated by the arrows in FIG. 1E), in which the thermal interface material 108 below the heat spreader 107 is subjected to a compression force (e.g., by pressing a compression part or body (not shown) with appropriate weight against the top surface 107B of the heat spreader 107) for a period of time. Afterwards, a curing process is performed to fully cure the thermal interface material 108. In the curing process, the thermal interface material 108 is subjected to a hot plate or oven, for example at a temperature of above 100° C. for a period of time in some embodiments. Once the compression and curing process is completed, the heat spreader 107 and the underlying thermal interface material 108 may uniformly cover the entire top surface 103A of the chip 103 and the entire top surface 106A of the molding compound 106.

Figure 1F:
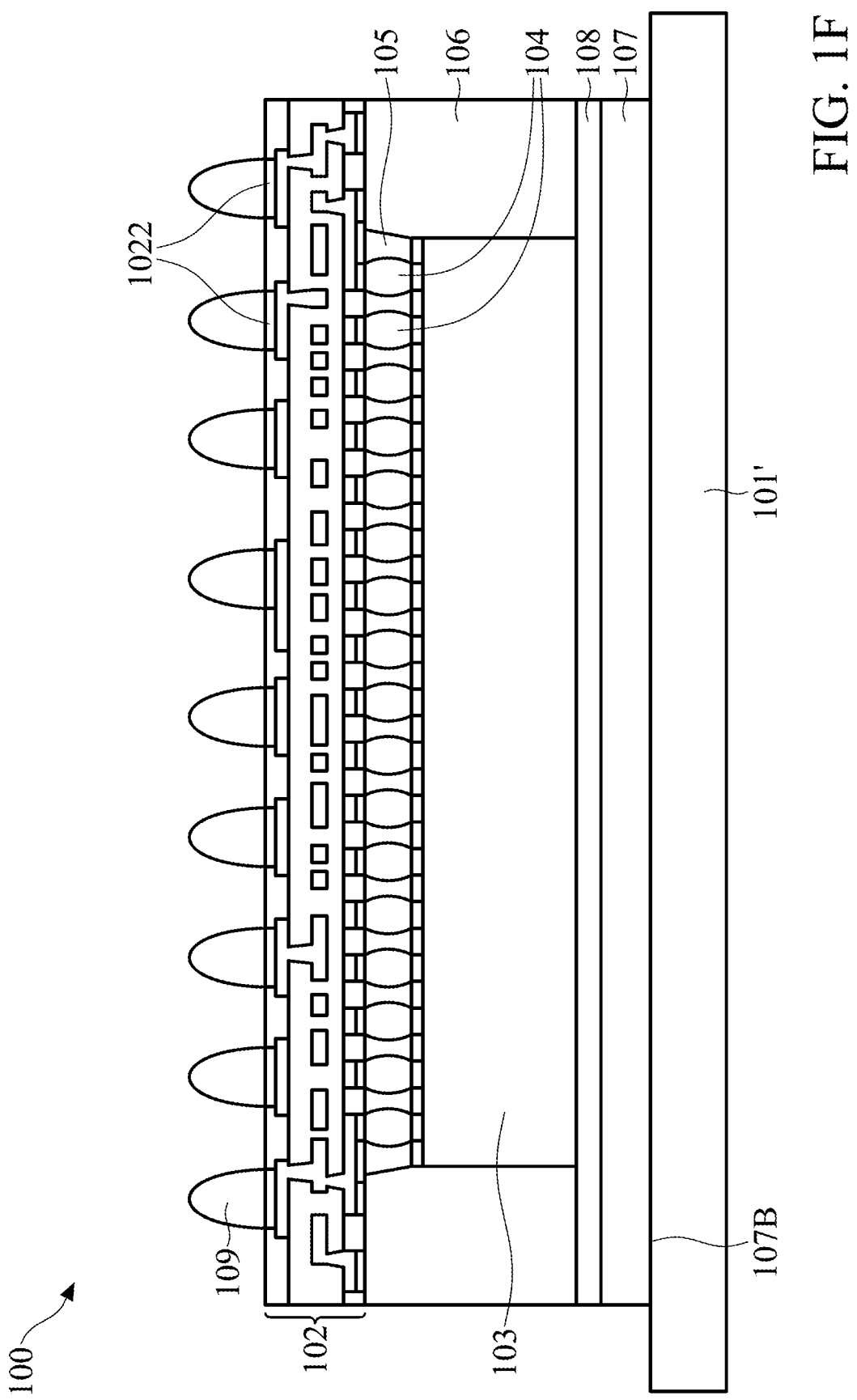
FIG. 1F is a cross-sectional view of an intermediate stage in the fabrication of a semiconductor package in accordance with some embodiments.

Referring to FIG. 1F, another carrier 101', similar to the carrier 101 (FIG. 1E), is bonded to the top of the resulting structure of FIG. 1E (i.e., the heat spreader 107), and then the carrier 101 is detached from the package substrate 102. In some embodiments, a sacrificial layer (not shown) is formed between the carrier 101 and the package substrate 102. When the sacrificial layer is removed by any suitable etching or cutting process, the carrier 101 can be detached from the package substrate 102. Afterwards, a number of electrical connectors 109, such as BGA, may be formed on the first surface 102A of the package substrate 102 (i.e., they are electrically connected to the conductive features 1022), in some embodiments as shown in FIG. 1F. The electrical connectors 109 may be configured to electrically connect the fabricated semiconductor package 100 (FIG. 2A) to an external device (e.g., a PCB (not shown)). In some embodiments, the electrical connectors 109 comprise lead-free solder or the like.

Figure 1G:
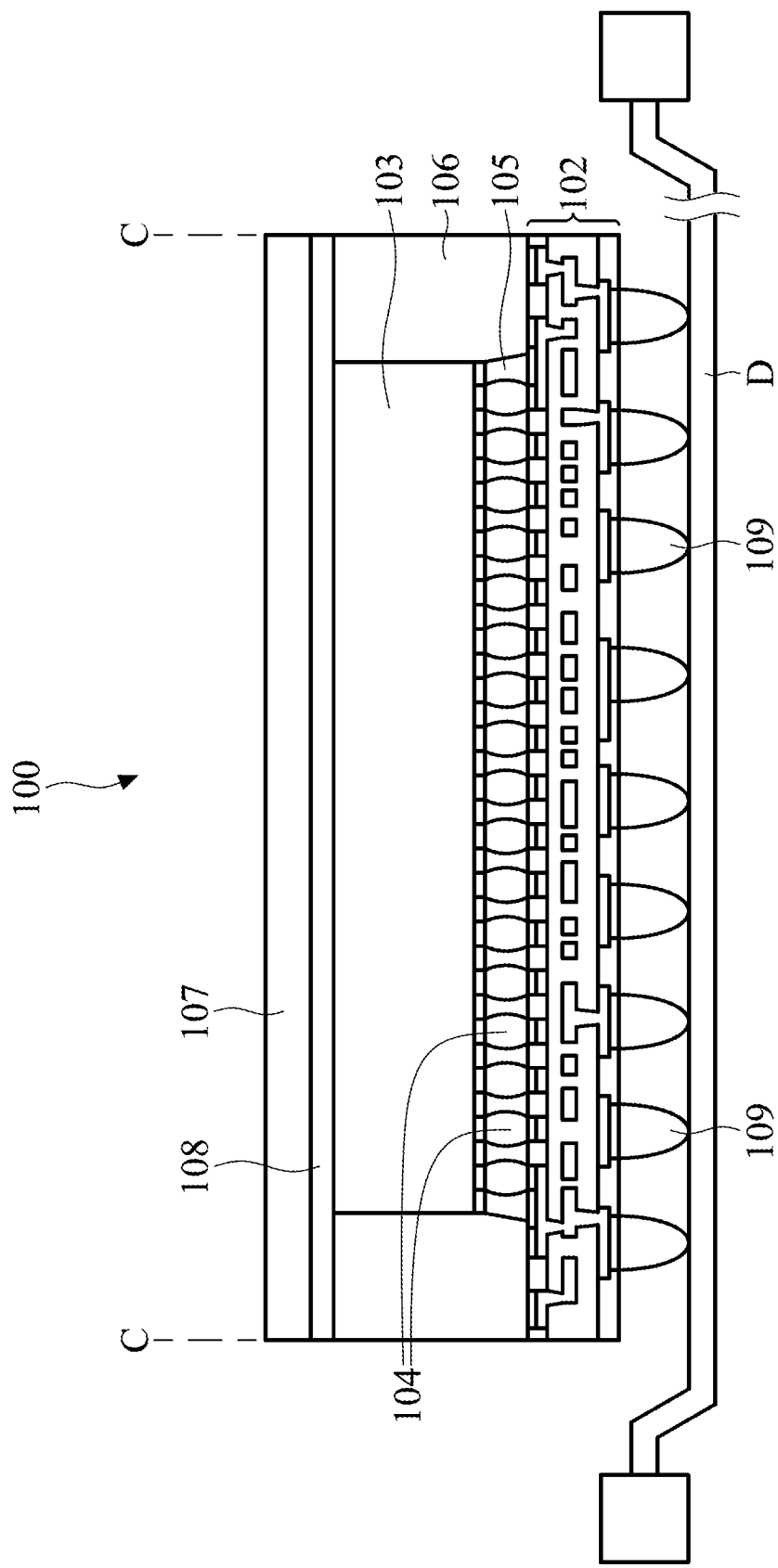
FIG. 1G is a cross-sectional view of an intermediate stage in the fabrication of a semiconductor package in accordance with some embodiments.

Referring to FIG. 1G, the resulting structure of FIG. 1F is placed so that the electrical connectors 109 side is affixed to a dicing tape D or a die frame (not shown), and then the carrier 101' (FIG. 1F) is detached from the heat spreader 107 by, for example the detaching process for the carrier 101 described above. Afterwards, a singulation process (also referred to as a saw process) is performed. In the singulation process, the heat spreader 107, thermal interface material 108, molding compound 106, and package substrate 102 are die cut or diced along cutting lines C (depicted by dashed lines) to separate the package of the chip 103, heat spreader 107, and thermal interface material 108 into individual units. Each individual unit (i.e. a semiconductor package 100 unit) includes the heat spreader 107 attached to the chip 103 by the thermal interface material 108. After removing the dicing tape D, the fabrication of a semiconductor package 100 (FIG. 2A) is completed.

It should be understood that the chip 103 (especially for that having a high power requirement) of the semiconductor package 100 can result in localized overheating H during the operation, as shown in FIG. 2A. With the heat spreader 107 attached on top of the chip 103, it provides a thermal path through which heat that is generated by the chip 103 is dissipated to the surrounding environment to prevent chip overheating. For example, when the localized overheating H is close to the center position of the heat spreader 107, the heat may be conducted from the chip 103 to the center position of the heat spreader 107 through the thermal interface material 108, then spread horizontally over the entire heat spreader 107 (i.e., conducted from the center position to other positions), and finally dissipated to the surrounding environment (the thermal path through the thermal interface material 108 and heat spreader 107 is shown by the arrows depicted in FIG. 2A). It should be appreciated that the heat spreader 107 utilizing a graphite sheet may provide a high degree of heat dissipation, especially in the horizontal direction, thereby avoiding overheating of the chip 103 (i.e., the heat generated by the chip 103 can be dissipated or removed rapidly). Moreover, the semiconductor package 100 can also have a small thickness T due to the thin heat spreader 107.

Although not shown, it should be understood that the heat generated by the chip 103 may also be conducted to the electrical connectors 109 side of the semiconductor package 100 (alternatively be further conducted to the external device such as PCB) through the electrical connectors 104 and the metal lines in the package substrate 102, but the heat dissipation by this thermal path is relatively low.

Figure 2B:
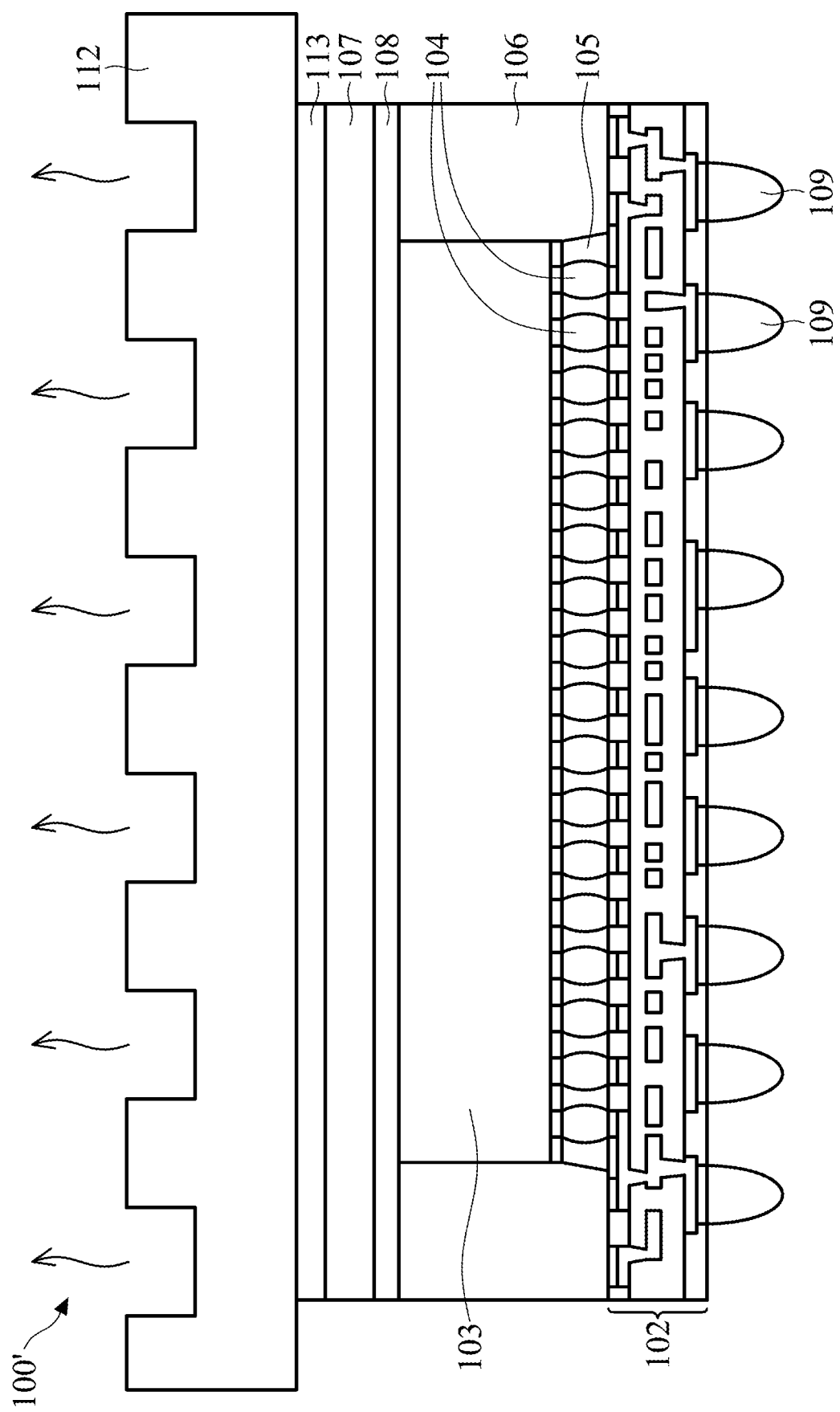
FIG. 2B is a cross-sectional view of a semiconductor package including a heat sink in accordance with some embodiments.

FIG. 2B is a cross-sectional view of a semiconductor package 100' including a heat sink 112 in accordance with some embodiments. In the semiconductor package 100', a heat sink 112 is attached on top of the heat spreader 107 by a thermal interface material (TIM) 113 to facilitate the dissipation of heat from the chip 103. The thermal interface material 113 may be similar to the thermal interface material 108, and is not repeated here. The heat sink 112 may be formed of a metal or a metal alloy that has a high thermally conductivity. It should be appreciated that the heat spreader 107 can support the heat sink 112 (i.e., withstand the loading of the heat sink 112) and protect the chip 103 from being easily damaged due to direct contact with the heat sink 112 without unduly hindering heat transfer to the heat sink 112. Accordingly, the thermal and mechanical performance of the semiconductor package using the heat spreader 107 are also improved.

Figure 3A:
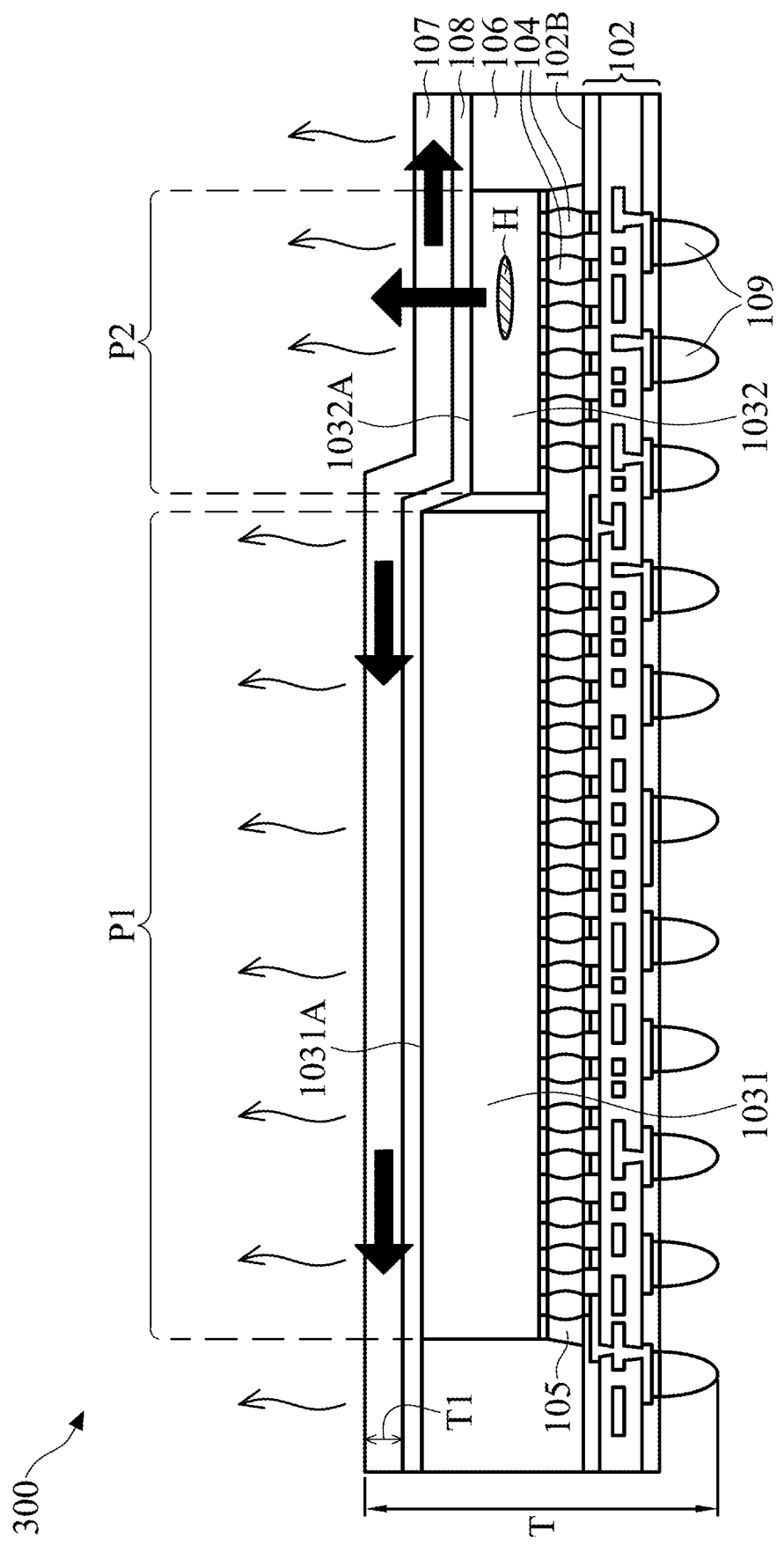
FIG. 3A is a cross-sectional view of a semiconductor package including multiple chips in accordance with some embodiments.

FIG. 3A is a cross-sectional view of a semiconductor package 300 including multiple chips in accordance with some embodiments. As shown in FIG. 3A, the semiconductor package 300 includes two chips 1031 and 1032. However, the semiconductor package 300 according to other embodiments may also include more than two chips. Other elements of the semiconductor package 300 indicated with the same reference numerals as the corresponding elements of the semiconductor package 100 or 100' may be similar or identical to the elements of the semiconductor package 100 or 100', and the descriptions of those are omitted.

In the embodiments illustrated in FIG. 3A, the two chips (such as a first chip 1031 and a second chip 1032) mounted on the top surface 102B of the package substrate 102 have different thicknesses. For example, the thickness of first chip 1031 is greater than the thickness of the thickness of second chip 1032. However, the first chip 1031 and second chip 1032 may have the same thickness in alternative embodiments. In some embodiments, the first chip 1031 is a memory chip, and the second chip 1032 is a process chip, although the chips 1031 and 1032 may be other type of chips in any combination. In some embodiments, at least one of the chips 1031 and 1032 (e.g., the second chip 1032) can result in localized overheating H during the operation.

Being flexible, the heat spreader 107 (e.g., a graphite sheet) conforms to the profile of top surface 1031A of the first chip 1031 and the profile of top surface 1032A of the second chip 1032 when it is attached on top of the first chip 1031 and the second chip 1032 by the thermal interface material 108. As shown in FIG. 3A, when the heat spreader 107 is attached on top of the first chip 1031 and the second chip 1032, it covers the entire top surface 1031A of the first chip 103 and the entire top surface 1032A of the second chip 1032. Furthermore, a first portion P1 of the heat spreader 107 over the first chip 1031 and a second portion P2 of the heat spreader 107 over the second chip 1032 have the same thickness T1 (similarly, a first portion of the thermal interface material 108 over the first chip 1031 and a second portion of the thermal interface material 108 over the second chip 1032 have the same thickness). In some embodiments, the heat spreader 107 over the first chip 1031, second chip 1032, and molding compound 106 has a uniform thickness. As described above, the semiconductor package 300 may have a small thickness T due to the thin heat spreader 107.

With the above configuration, the heat spreader 107 provides a thermal path through which heat that is generated by at least one of the chips 1031 and 1032 is dissipated to the surrounding environment to prevent chip overheating. For example, when a localized overheating H occurs on the second chip 1032, the heat may be conducted from the second chip 1032 to the heat spreader 107 through the thermal interface material 108, then spread horizontally over the entire heat spreader 107 (i.e., conducted from one position close to the second chip 1032 to other positions), and finally dissipated to the surrounding environment (the thermal path through the thermal interface material 108 and heat spreader 107 is shown by the arrows depicted in FIG. 3A). Accordingly, the overheating issue of the second chip 1032 can be solved. The heat generated from the first chip 1031 may also be dissipated to the surrounding environment through the thermal interface material 108 and heat spreader 107.

Figure 3B:
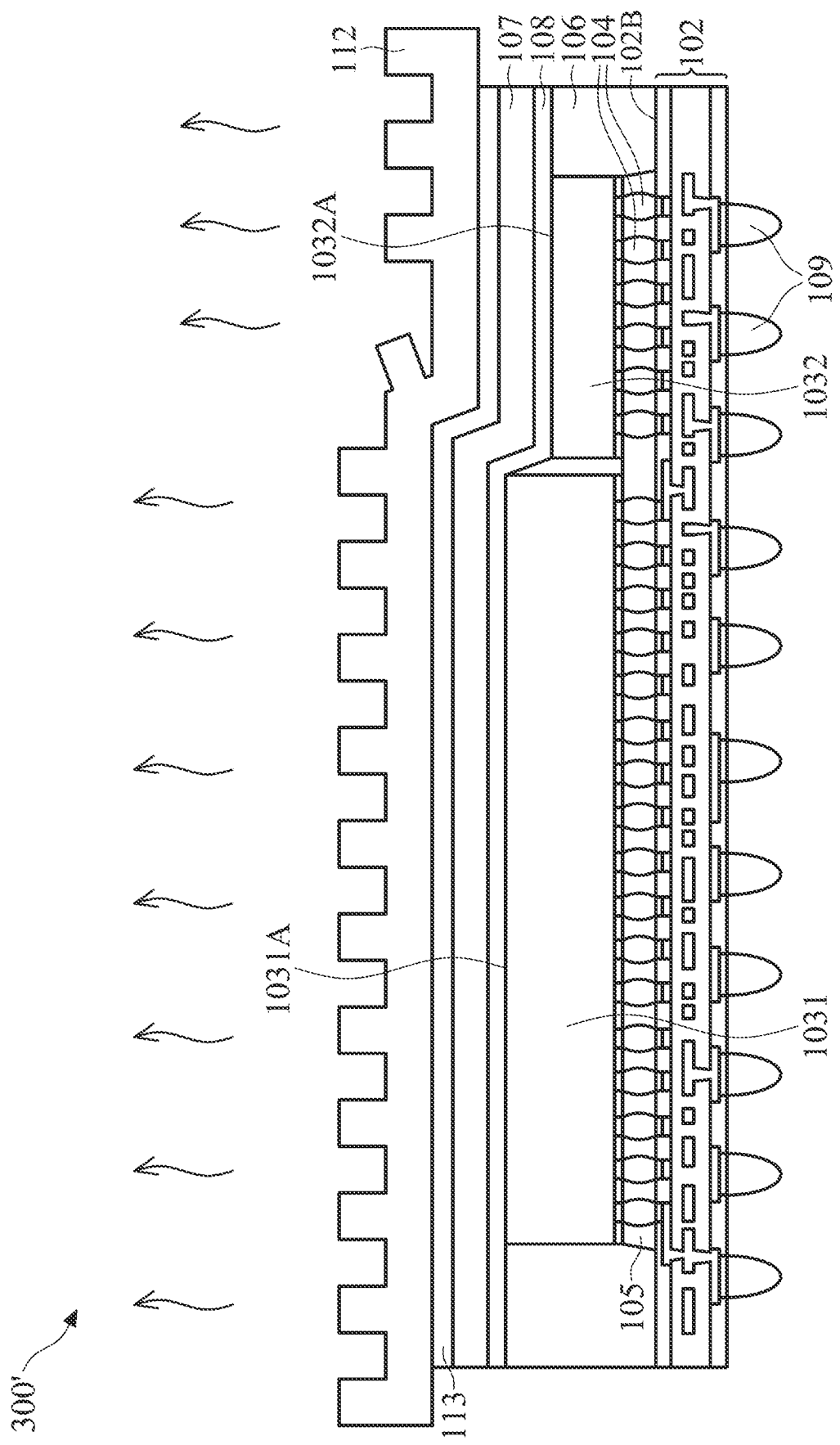
FIG. 3B is a cross-sectional view of a semiconductor package including a heat sink in accordance with some embodiments.

Referring to FIG. 3B, in some alternative embodiments, a (metal) heat sink 112 with a bottom surface that conforms to the profile of the top surface of the heat spreader 107 may also be attached on top of the heat spreader 107 by a thermal interface material 113 to facilitate the dissipation of heat from the chips 1031 and 1032. The heat spreader 107 can further support the heat sink 112 (i.e., withstand the loading of the heat sink 112) and protect the chips 1031 and 1032 from being easily damaged due to direct contact with the heat sink 112 without unduly hindering heat transfer to the heat sink 112. Accordingly, the thermal and mechanical performance of the semiconductor package 300' using the heat spreader 107 are also improved.

Figure 4:
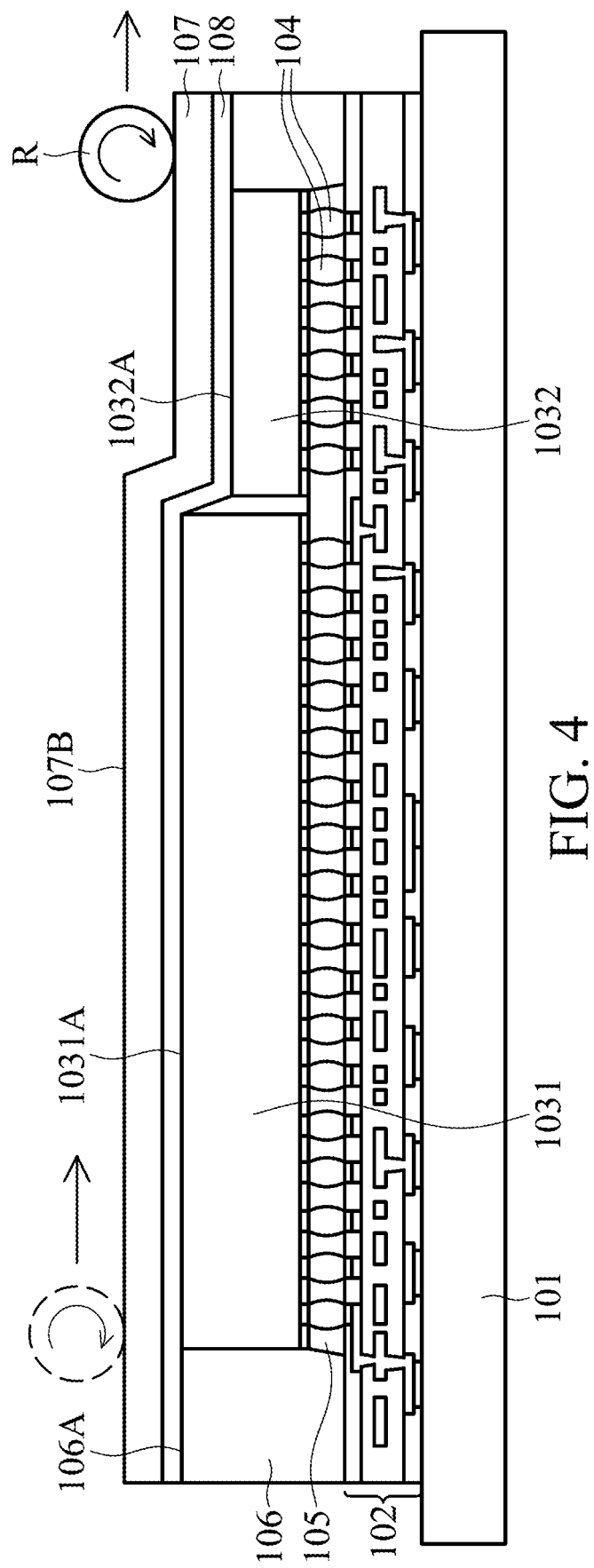
FIG. 4 schematically shows that the heat spreader is attached on top of the first and second chips by rolling a rod over the top surface of the heat spreader in accordance with some embodiments.

It should be understood that the semiconductor package 300 (FIG. 3A) with multiple chips may also be formed by the fabrication method illustrated in FIGS. 1A-1G. For example, as shown in FIG. 4, after the heat spreader 107 with the thermal interface material 108 is placed over the chips 1031, 1032 and the molding compound 106, an attachment process is performed. The attachment process (similar to the attachment process shown in FIG. 1D) includes rolling a rod R over the top surface 107B of the heat spreader 107 (e.g., from one side (such as the left side in the figure) of the heat spreader 107 to the opposite side (such as the right side in the figure) thereof) to attach the heat spreader 107 to the chips 1031 and 1032 and the molding compound 106 through the thermal interface material 108. By doing it this way, the flexible heat spreader 107 can be easily and smoothly attached to the top surface 1031A of the first chip 1031, the top surface 1032A of the second chip 1032, and the top surface 106A of the molding compound 106 (i.e., to conform to the profile of the top surfaces of the first chip 1031, the second chip 1032 and the molding compound 106).

Figure 5:
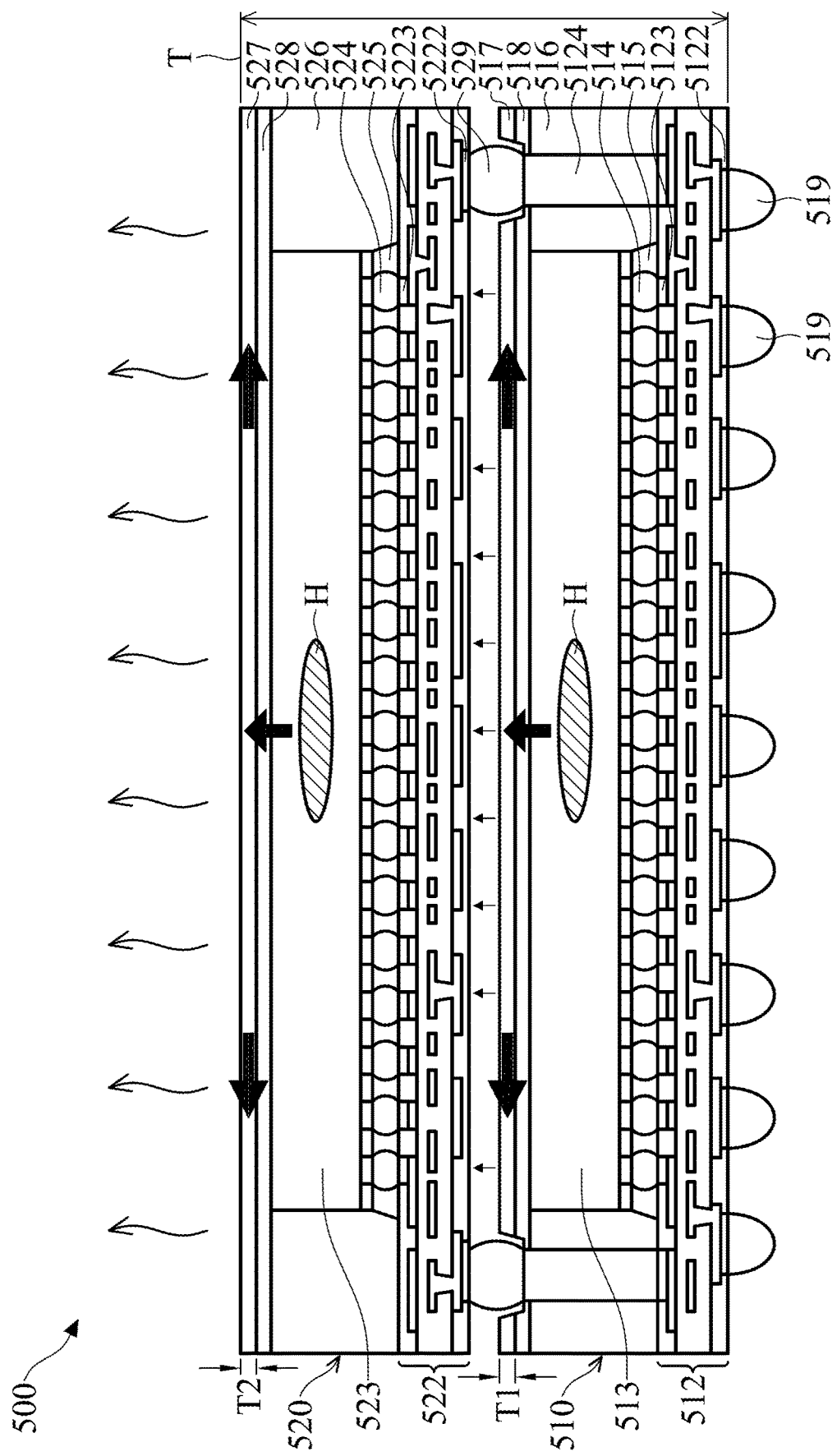
FIG. 5 is a cross-sectional view of a semiconductor package including multiple package units stacked on each other in accordance with some embodiments.

FIG. 5 is a cross-sectional view of a semiconductor package 500 including multiple package units stacked on each other in accordance with some embodiments. As shown in FIG. 5, the semiconductor package 500 includes two stacking package units 510 and 520. However, the semiconductor package 500 according to other embodiments may also include more than two stacking package units. The first package unit 510 (also referred as a bottom packing unit) may be configured to be electrically connected to an external device (e.g., a PCB (not shown)), and the second package unit 520 (also referred as a top packing unit) may be configured to be stacked on top of the first package unit 510 and electrically connected to the first package unit 510.

Figure 6A:
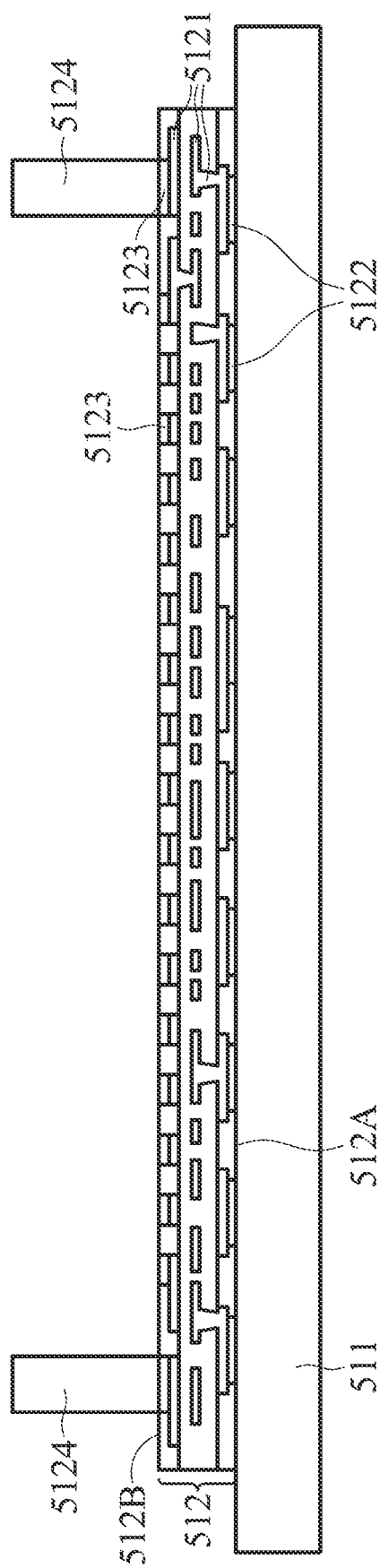
FIG. 6A is a cross-sectional view of an intermediate stage in the fabrication of the semiconductor package in FIG. 5 in accordance with some embodiments.
Figure 6B:
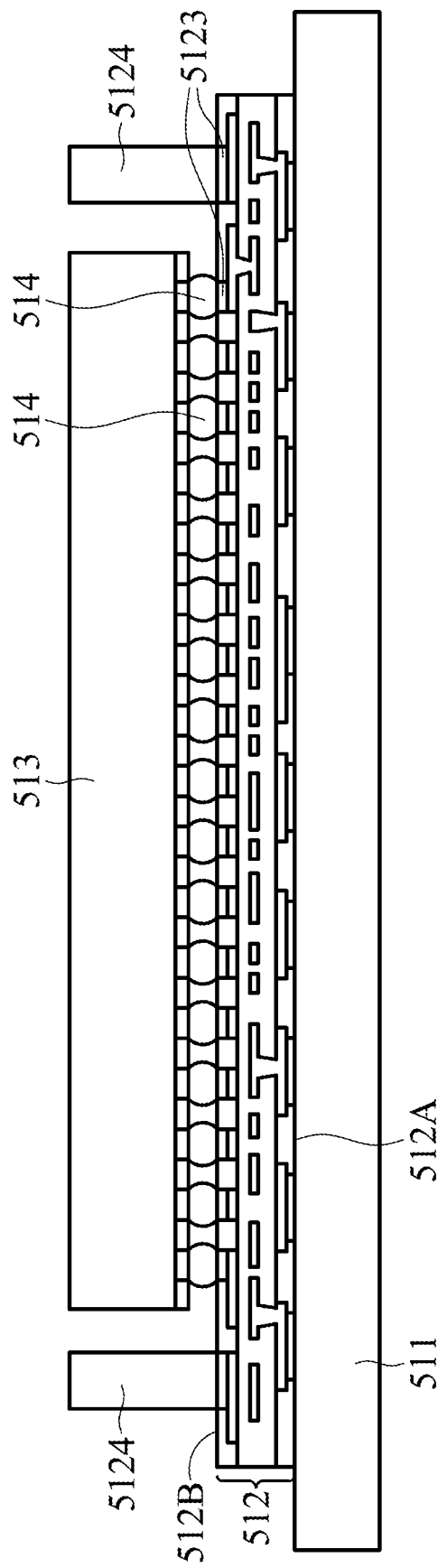
FIG. 6B is a cross-sectional view of an intermediate stage in the fabrication of the semiconductor package in FIG. 5 in accordance with some embodiments.
Figure 6C:
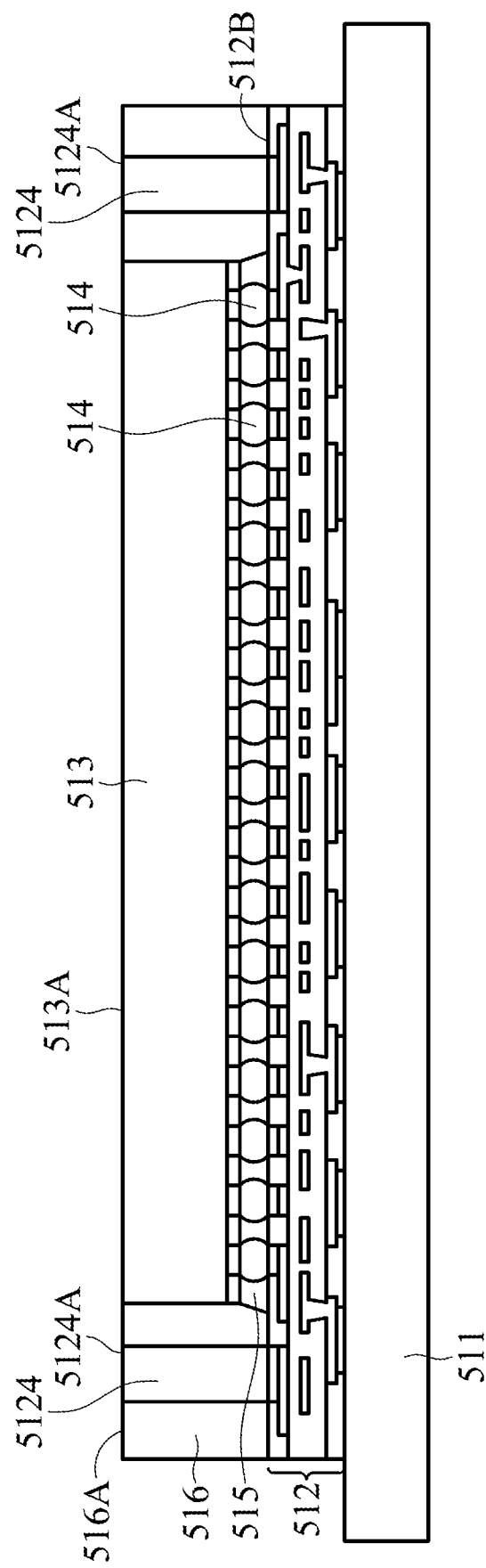
FIG. 6C is a cross-sectional view of an intermediate stage in the fabrication of the semiconductor package in FIG. 5 in accordance with some embodiments.
Figure 6D:
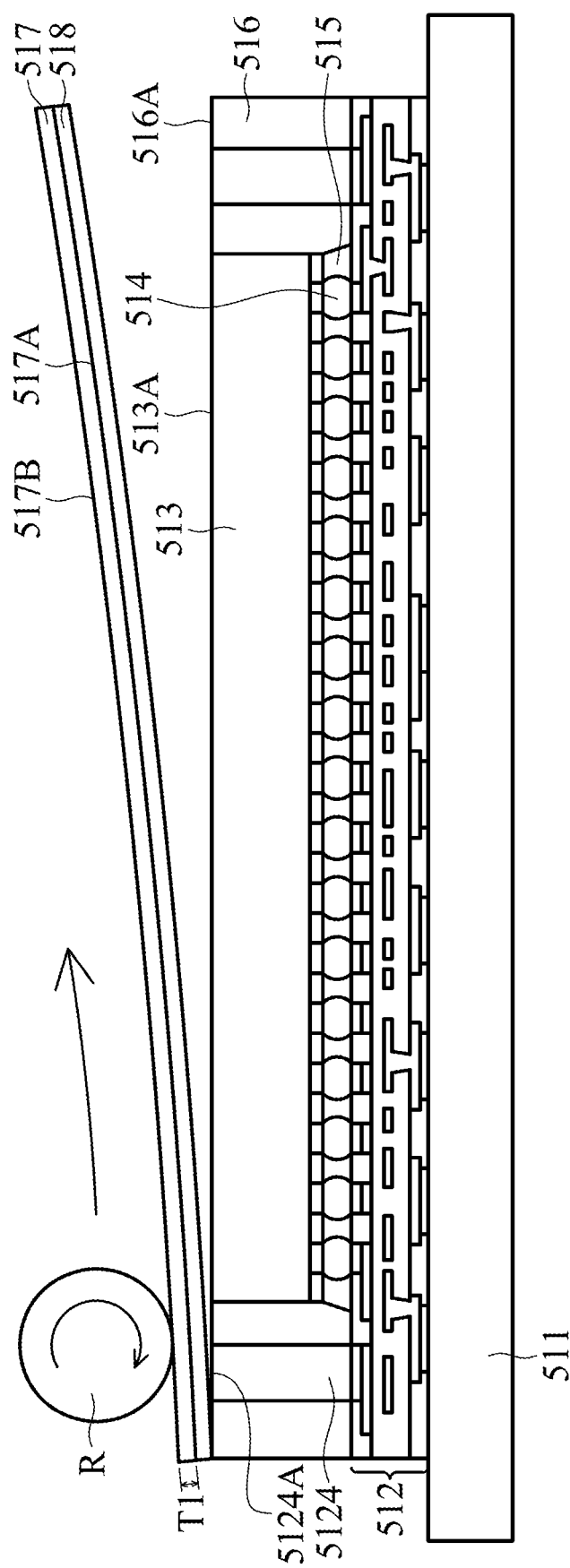
FIG. 6D is a cross-sectional view of an intermediate stage in the fabrication of the semiconductor package in FIG. 5 in accordance with some embodiments.
Figure 6E:
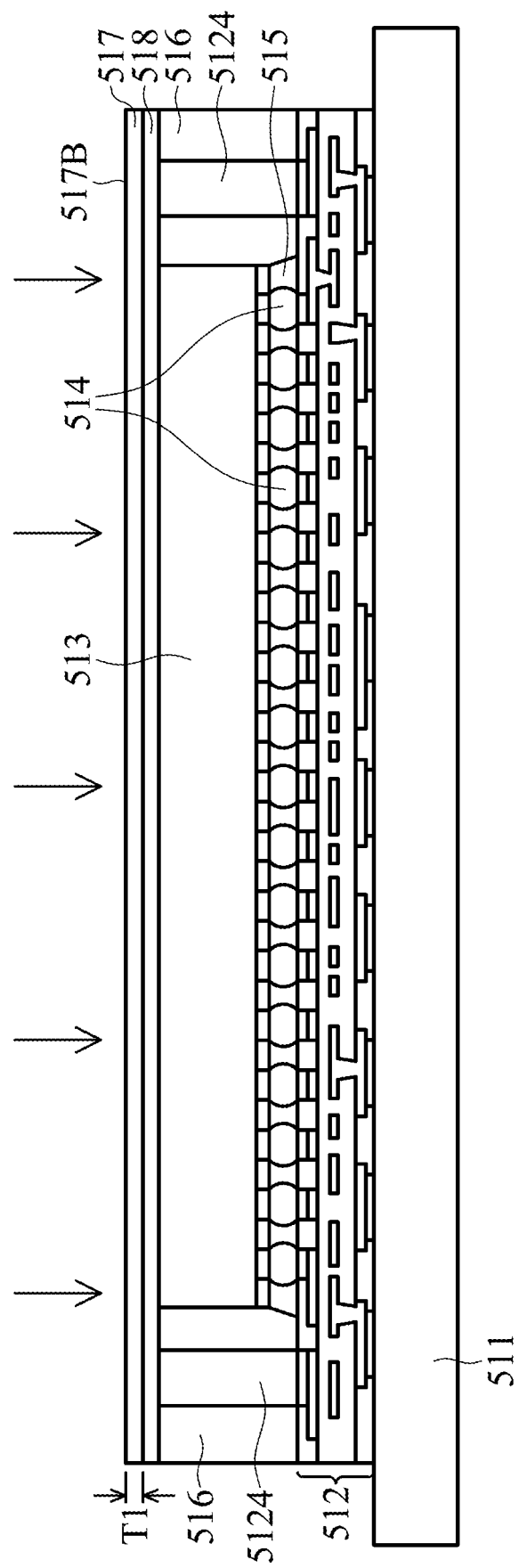
FIG. 6E is a cross-sectional view of an intermediate stage in the fabrication of the semiconductor package in FIG. 5 in accordance with some embodiments.
Figure 6F:
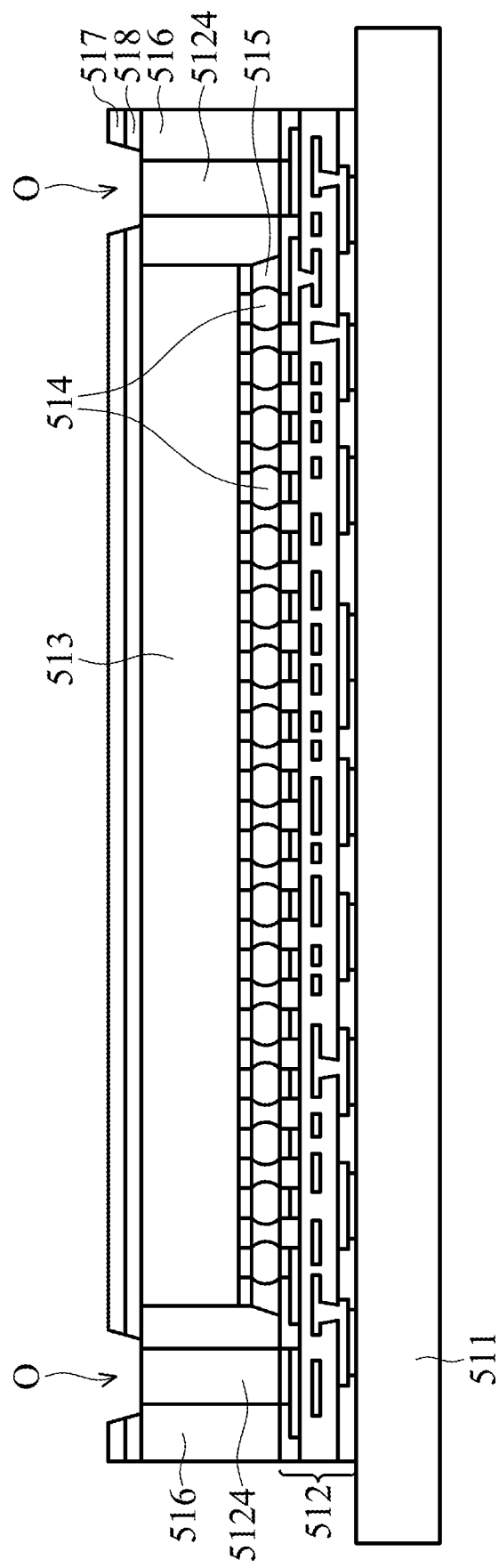
FIG. 6F is a cross-sectional view of an intermediate stage in the fabrication of the semiconductor package in FIG. 5 in accordance with some embodiments.
Figure 6G:
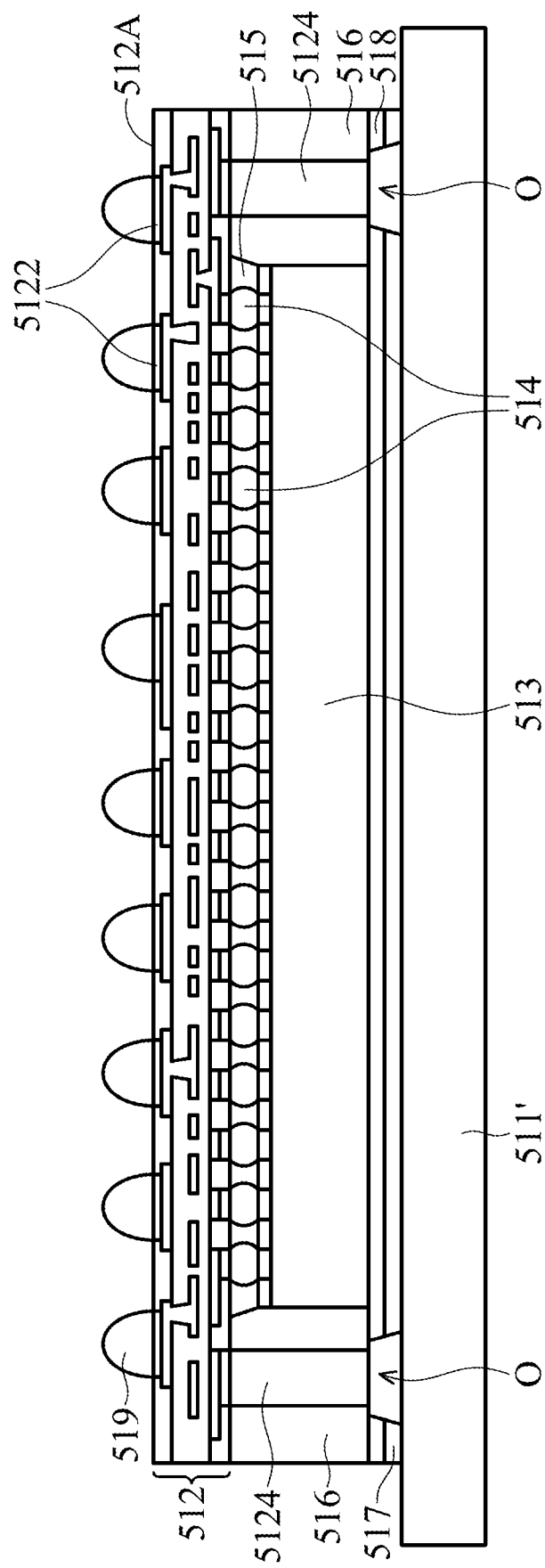
FIG. 6G is a cross-sectional view of an intermediate stage in the fabrication of the semiconductor package in FIG. 5 in accordance with some embodiments.
Figure 6H:
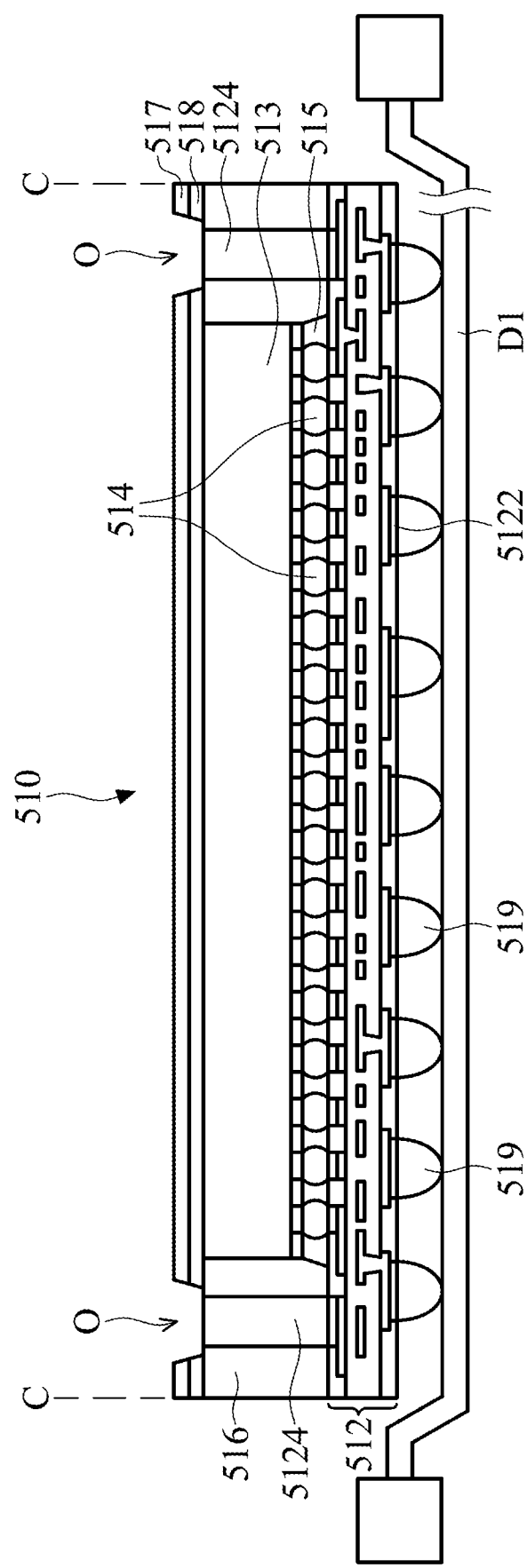
FIG. 6H is a cross-sectional view of an intermediate stage in the fabrication of the semiconductor package in FIG. 5 in accordance with some embodiments.
Figure 6I:
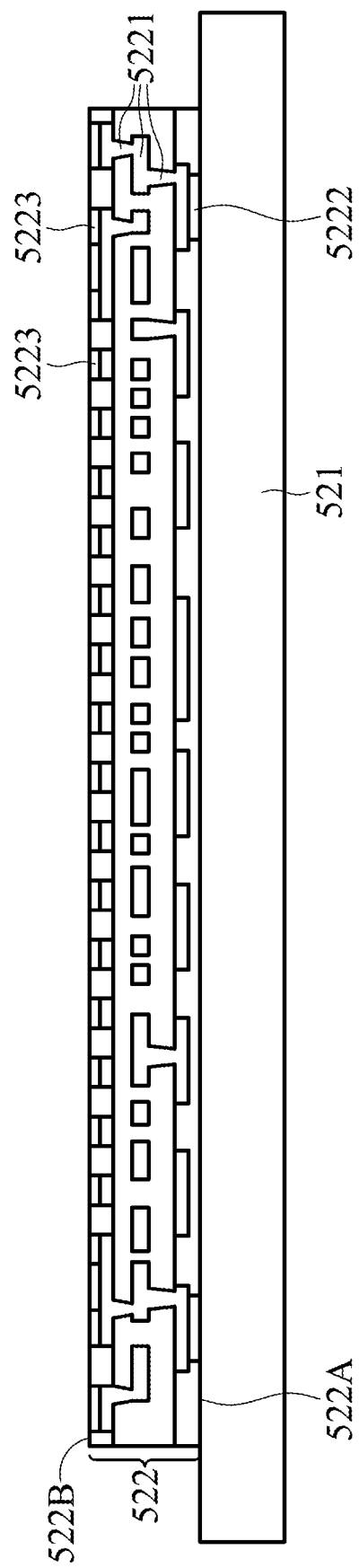
FIG. 6I is a cross-sectional view of an intermediate stage in the fabrication of the semiconductor package in FIG. 5 in accordance with some embodiments.
Figure 6J:
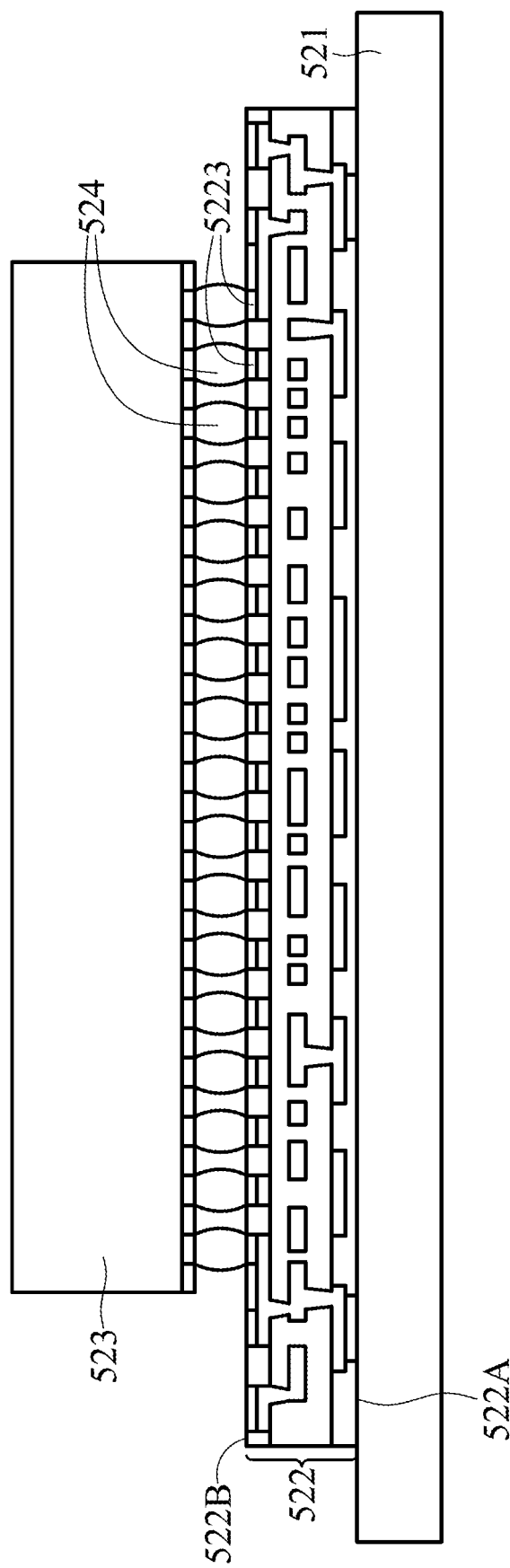
FIG. 6J is a cross-sectional view of an intermediate stage in the fabrication of the semiconductor package in FIG. 5 in accordance with some embodiments.
Figure 6K:
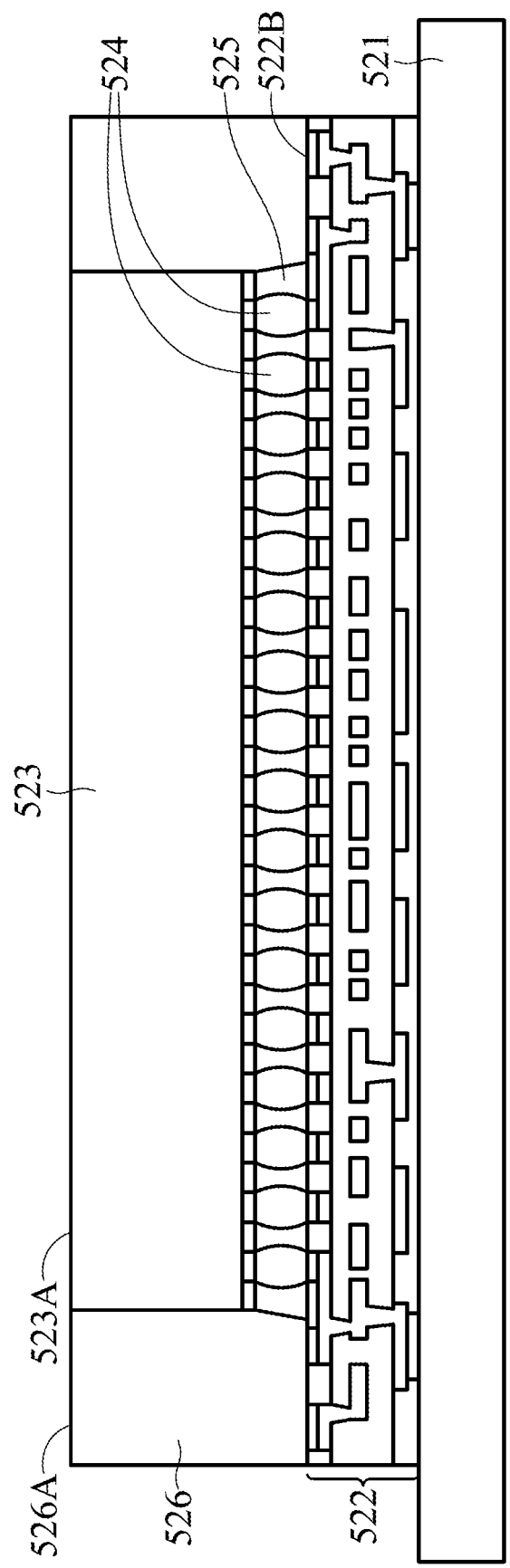
FIG. 6K is a cross-sectional view of an intermediate stage in the fabrication of the semiconductor package in FIG. 5 in accordance with some embodiments.
Figure 6L:
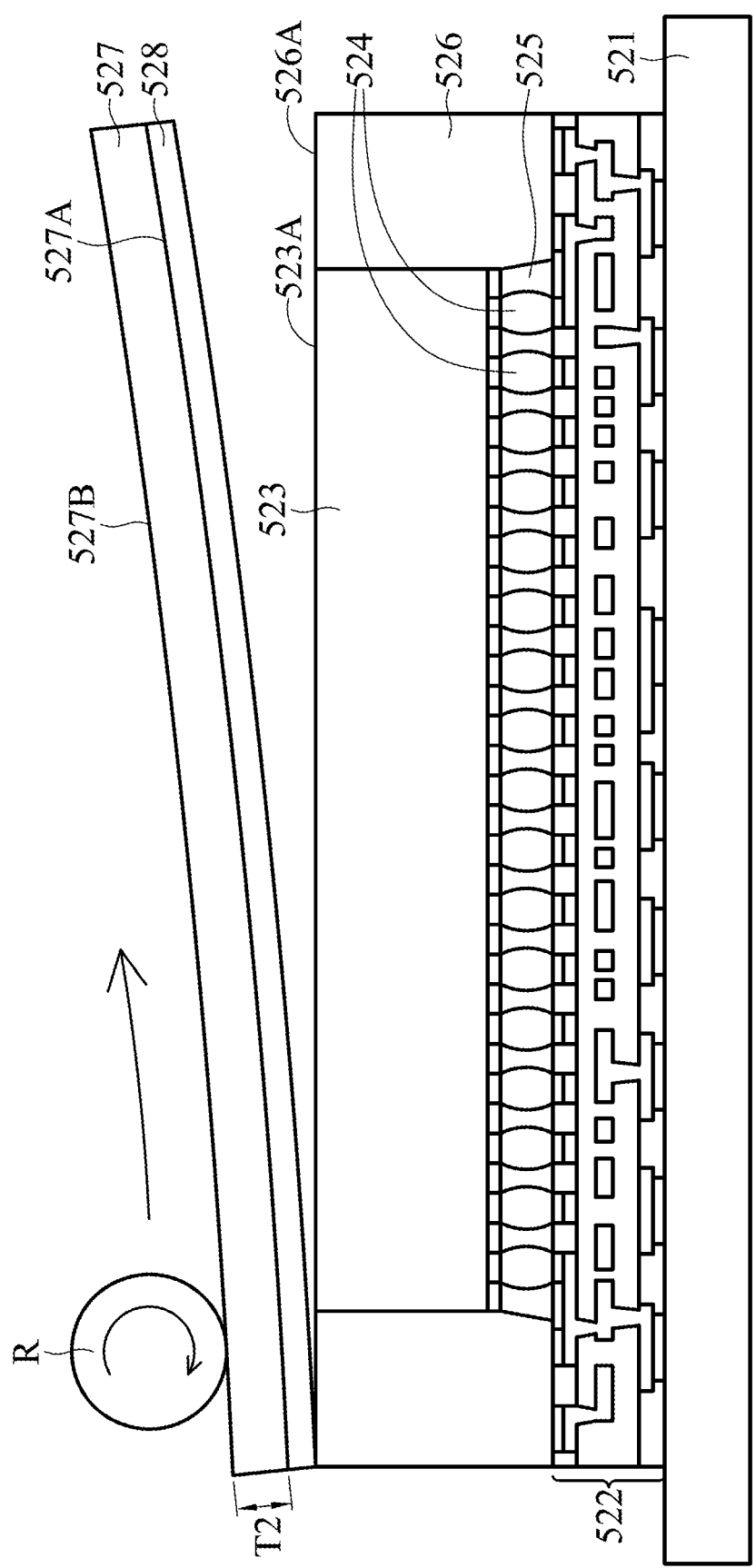
FIG. 6L is a cross-sectional view of an intermediate stage in the fabrication of the semiconductor package in FIG. 5 in accordance with some embodiments.
Figure 6M:
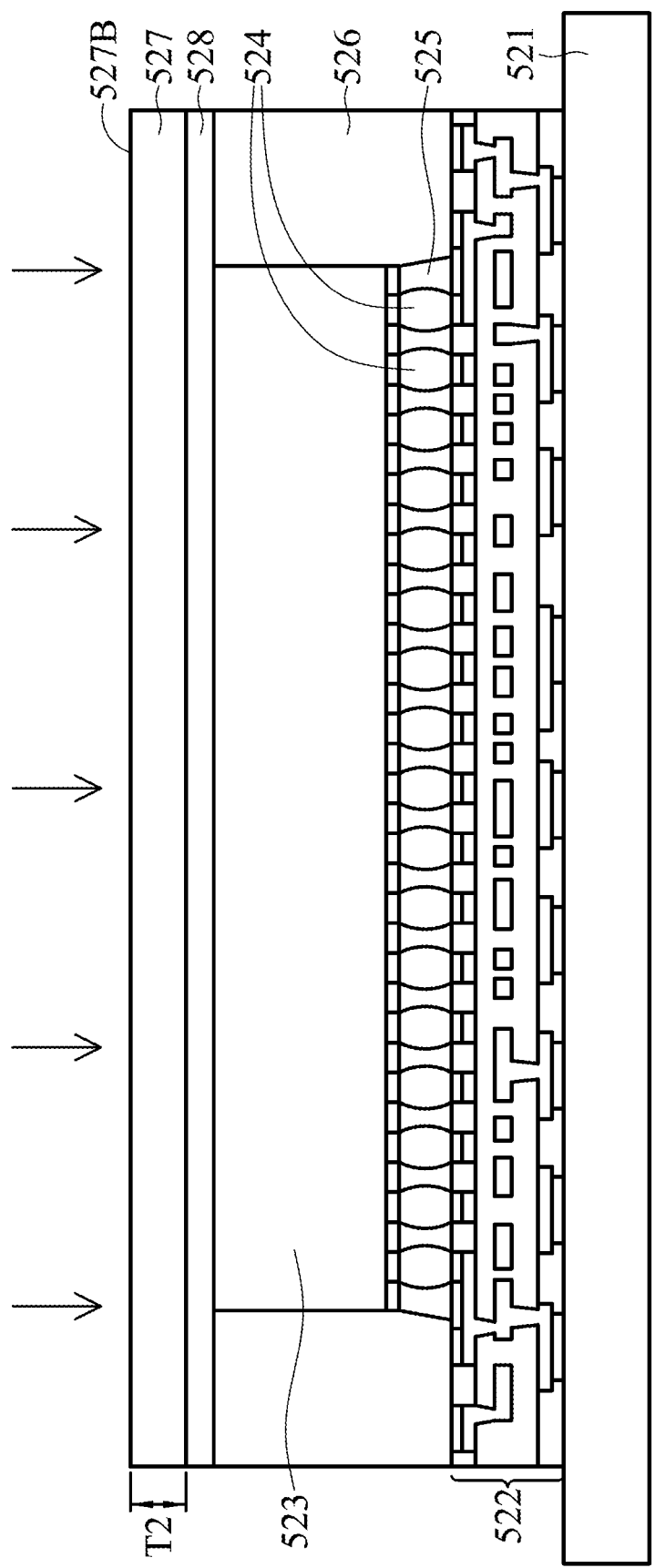
FIG. 6M is a cross-sectional view of an intermediate stage in the fabrication of the semiconductor package in FIG. 5 in accordance with some embodiments.
Figure 6N:
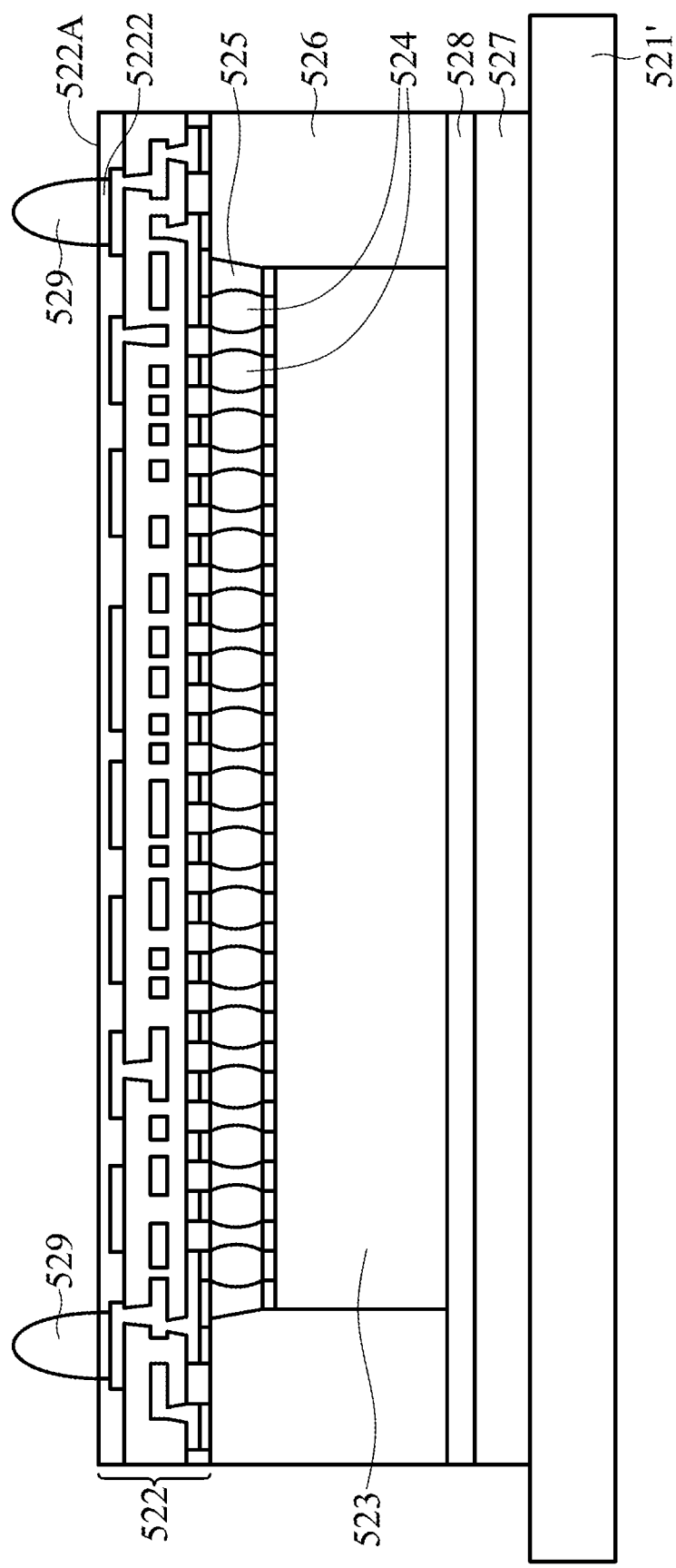
FIG. 6N is a cross-sectional view of an intermediate stage in the fabrication of the semiconductor package in FIG. 5 in accordance with some embodiments.
Figure 60:
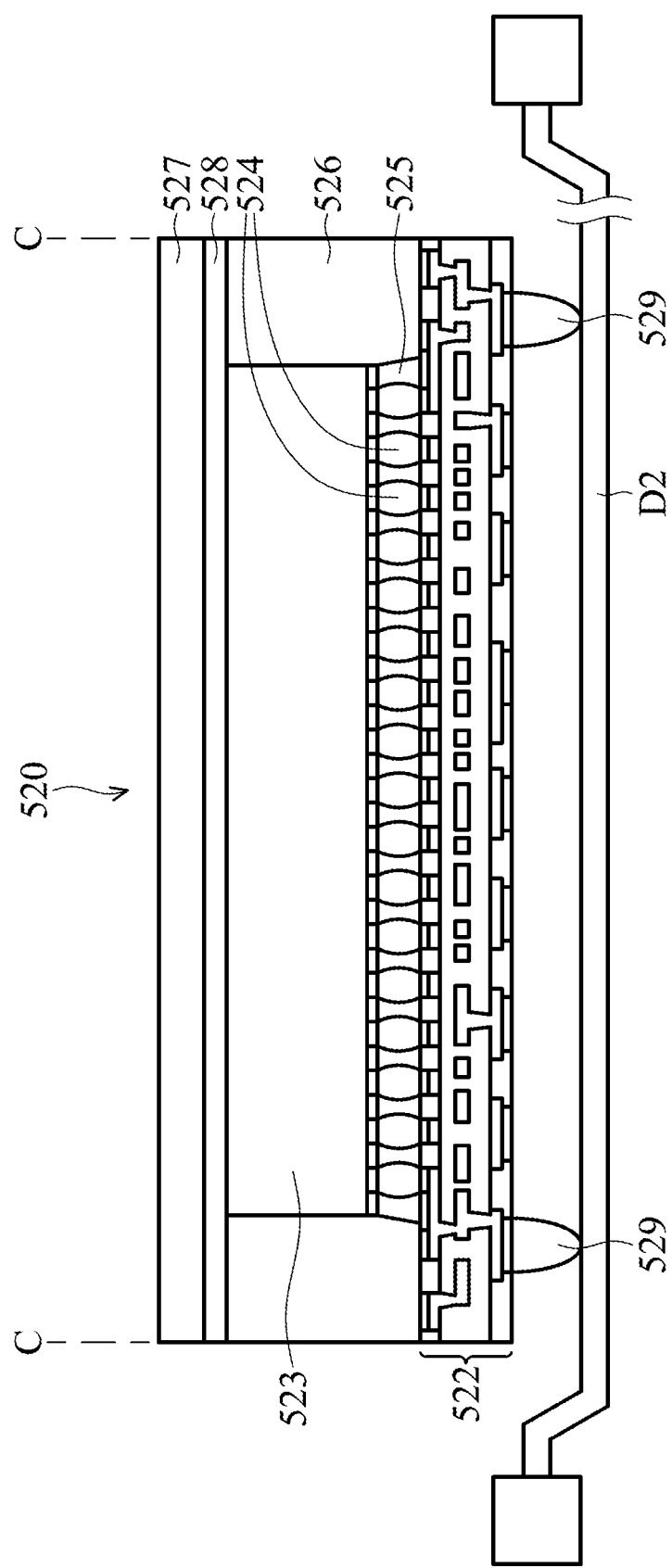
Figure 6P:
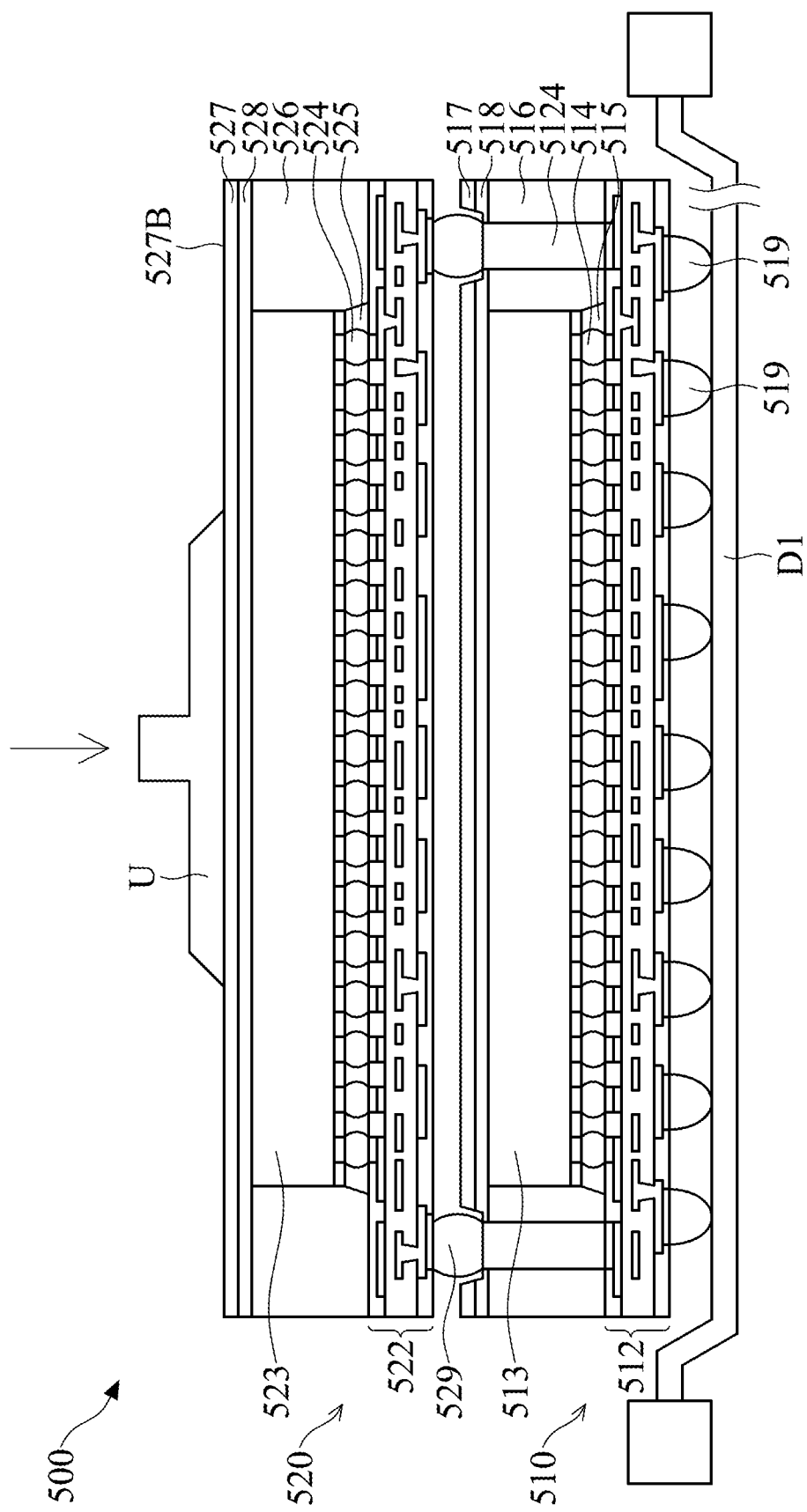
FIG. 6P is a cross-sectional view of an intermediate stage in the fabrication of the semiconductor package in FIG. 5 in accordance with some embodiments.

FIGS. 6A-6P are cross-sectional views of the semiconductor package 500 in FIG. 5 at various stages of fabrication in accordance with some embodiments, wherein FIGS. 6A-6H schematically shows the first package unit at various stages of fabrication and FIGS. 6I-6P schematically shows the second package unit at various stages of fabrication. It should be understood that FIGS. 6A-6P have been simplified for a better illustration of the concepts of the present disclosure. Moreover, the materials, geometries, dimensions, structures, and process parameters described herein are only illustrative, and are not intended to be, and should not be constructed to be, limiting to the present disclosure. Many alternatives and modifications will be apparent to those skilled in the art, once informed by the present disclosure.

Referring to FIG. 6A, a first carrier 511 is provided. The first carrier 511 may be configured to provide structural rigidity or a base for deposition of subsequent material layers or films. The first carrier 511 is a substrate carrier or a semiconductor wafer carrier (e.g., silicon wafer) in some embodiments. However, the first carrier 511 may also be a glass carrier, a ceramic carrier, or the like.

A first package substrate 512 is formed on the first carrier 511. The first package substrate 512 may include one or more dielectric layers. Conductive redistribution lines 5121 (e.g., metal lines) may be formed in or between the dielectric layers to electrically couple a number of conductive features 5122 and 5123 (e.g., conductive pads) on opposite surfaces of the first package substrate 512. For example, the first package substrate 512 may be formed by depositing dielectric layers through a chemical vapor deposition (CVD), physical vapor deposition (PVD), atomic layer deposition (ALD), spin-on coating, lamination, or another suitable deposition process, depositing metal layers on or between the dielectric layers through any suitable deposition process described above, and patterning the metal layers to form the conductive redistribution lines 5121 and conductive features 5122, 5123 through a lithography process and an etching process (e.g., wet or dry etching process). In some embodiments, the dielectric layers comprise polymer, polyimide, silicon oxide, silicon nitride, or another suitable dielectric material. The metal layers comprise Cu, Pt, Ag, Ni, another suitable metal, alloys thereof, or a combination thereof.

As shown in FIG. 6A, the first package substrate 512 has a first surface 512A (e.g., the bottom surface) attached to the first carrier 511 and a second surface 512B (e.g., the top surface) opposite to the first surface 512A. The conductive features 5123 exposed to the second surface 512B are configured to be electrically connected to first chips 513 (see FIG. 6B), and the conductive features 5122 exposed to the first surface 512A are configured to electrically connect to an external device (e.g., a PCB (not shown)). In some embodiments, the first package substrate 512 also includes active and/or passive components (not shown).

Furthermore, a number of through vias 5124 (i.e., metal pillars) are formed over the first package substrate 512 and are electrically connected to some conductive features 5123. The through vias 5124 (also referred to as "through integrated fan-out (InFO) vias (TIV)") may be configured to electrically connect the first package unit 510 to the second package unit 520 (see FIG. 5). In some embodiments, the through vias 5124 comprise Cu, Pt, Ag, Ni, another suitable metal, alloys thereof, or a combination thereof. For example, the through vias 5124 may be formed by depositing a dielectric layer over the first package substrate 512 through any suitable deposition process described above, patterning the dielectric layer through a lithography process and an etching process (e.g., wet or dry etching process) to form a number of openings or holes corresponding to some conductive features 5123, forming metal features (e.g., metal pillars) in the openings through plating (e.g., electro plating or electro-less plating), and removing the dielectric layer through any suitable etching process.

Referring to FIG. 6B, a number of first chips 513 are mounted on the first package substrate 512 (only one first chip 513 is depicted for simplicity). The first chips 513 may be mounted on the second surface 512B (the top surface) of the first package substrate 512 (i.e., they are electrically connected to the conductive features 5123) by electrical connectors 514, such as a ball grid array (BGA). In some embodiments, the electrical connectors 514 comprise lead-free solder or the like. A reflow process (not shown) may be performed to make the metallurgical connections in a chip-solder-chip carrier (i.e., the first chip 513-the electrical connectors 514-the first package substrate 512). The first chips 513 may be any suitable integrated circuit (IC) chip or die for a particular application. For example, the first chips 513 may be memory chips, logic chips, processor chips, or the like.

Referring to FIG. 6C, an underfill material 515 is dispensed (e.g., by a dispenser (not shown)) into the space between each first chip 513 and the first package substrate 512 and the space between adjacent electrical connectors 514, and then cured (e.g., ultraviolet (UV) or thermally cured) to harden. The underfill material 515 may be configured to provide a stronger mechanical connection and a heat bridge between the first chip 513 and the first package substrate 512, to reduce cracking in the electrical connectors 514 caused by thermal expansion mismatches between the first chip 513 and the first package substrate 512, and to protect the joints from contaminants, thereby improving reliability of the fabricated semiconductor package 500 (FIG. 5). In some embodiments, the underfill material 515 comprises liquid epoxy, deformable gel, silicon rubber, or the like.

Afterwards, a molding compound 516 is formed over the first package substrate 512 and encapsulates the side periphery of each first chip 513 (i.e., fills the gaps between the first chip 513 and the adjacent through vias 5124). The molding compound 516 also encapsulates the side peripheries of the through vias 5124 so that the through vias 5124 are formed in the molding compound 516. The molding compound 516 may be configured to provide package stiffness, a protective or hermetic shielding, and/or provide a heat conductive path to prevent chip overheating. The molding compound 516 may be formed by a spin-on coating process, an injection molding process, or the like. In some embodiments, the molding compound 516 comprises epoxy, epoxy with thermally conductive filler materials, plastic molding compound, or another suitable material.

In some embodiments, the molding compound 516 is formed in such a way that its top surface 516A is substantially level (coplanar) with the top surface 513A of first chip 513 and the top surface 5124A of through vias 5124 (i.e., the top surface 513A of first chip 513 and the top surface 5124A of through vias 5124 are exposed as shown in FIG. 6C). For example, the molding compound 516 may be formed to cover the top surface 513A of first chip 513 and the top surface 5124A of through vias 5124, and then planarized by a chemical mechanical polishing (CMP) process or another suitable grinding or etching process to remove a portion of the molding compound 516 to expose the top surface 513A of first chip 103 and the top surface 5124A of through vias 5124.

Referring to FIG. 6D, a first heat spreader 517 and a first thermal interface material (TIM) 518 are provided, and the first thermal interface material 518 is dispensed (e.g., by a dispenser (not shown)) on the bottom surface 517A of the first heat spreader 517. The first heat spreader 517 may have high thermal conductivity. Furthermore, the first heat spreader 517 may be flexible. In some embodiments, the first heat spreader 517 is a graphite sheet having a thermal conductivity between about 1000 W/m-K and 1800 W/m-K. Alternatively, the first heat spreader 517 may be a graphite sheet with metal reinforcement (i.e., it may comprise a metal material such as copper, aluminum, or another suitable metal) so that the structural strength of first heat spreader 517 is further improved to prevent it from crushing or cracking easily. It should be appreciated that a graphite sheet used as the first heat spreader 517 may have a higher thermal conductivity than a typical metal heat spreader, and may be flexible in order to facilitate the subsequent attachment process. In some embodiments, the thickness T1 of the first heat spreader 517 may be in a range between about 15 microns and about 70 microns to have a good flexibility (similar to the heat spreader 107 described above). The shape and size (in a top view) of the first heat spreader 517 may correspond to those of the first package substrate 512.

The first thermal interface material 518 may have a higher thermal conductivity than a typical adhesive material, however, the thermal conductivity of the first thermal interface material 518 may still be much lower than that of the first heat spreader 517. In some embodiments, the first thermal interface material 518 has a thermal conductivity between about 3 W/m-K and 8 W/m-K, although its thermal conductivity may also be slightly higher or lower. The first thermal interface material 518 may comprise an organic material, and it may also act as an adhesive. In some embodiments, the first thermal interface material 518 comprises a polymer matrix, a phase change polymer, a silicone-based matrix, a matrix additive (fluxing agent), a filler material (a metallic core with an organic solderability preservative coating), or the like. The first thermal interface material 518 may be dispensed in a liquid form that has a high viscosity.

After the first thermal interface material 518 is applied to the bottom surface 517A of the first heat spreader 517, the first heat spreader 517 is attached to the first chip 513 and the molding compound 516 by the first thermal interface material 518. In the embodiments illustrated in FIG. 6D, after the first heat spreader 517 with the first thermal interface material 518 is placed over the first chip 513 and molding compound 516, an attachment process is performed. The attachment process includes rolling a rod R over the top surface 517B of the first heat spreader 517 (e.g., from one side (such as the left side in the figure) of the first heat spreader 517 to the opposite side (such as the right side in the figure) thereof) to attach the first heat spreader 517 to the first chip 513 and molding compound 516 through the first thermal interface material 518. By doing it this way, the flexible first heat spreader 517 can be easily and smoothly attached to the top surface 513A of the first chip 513 and the top surface 516A of the molding compound 516.

Referring to FIG. 6E, a compression process is performed (as indicated by the arrows in FIG. 6E), in which the first thermal interface material 518 below the first heat spreader 517 is subjected to a compression force (e.g., by pressing a compression part or body (not shown) with appropriate weight against the top surface 517B of the first heat spreader 517) for a period of time. Afterwards, a curing process is performed to fully cure the first thermal interface material 518. In the curing process, the first thermal interface material 518 is subjected to a hot plate or oven, for example at a temperature of above 100° C. for a period of time in some embodiments. Once the compression and curing process is completed, the first heat spreader 517 and the underlying first thermal interface material 518 may uniformly cover the entire top surface 513A of the first chip 513 and the entire top surface 516A of the molding compound 516. Moreover, the first heat spreader 517 over the first chip 513 and molding compound 516 (as well as the through vias 5124) has a uniform thickness T1.

Referring to FIG. 6F, a number of openings O are formed in the first heat spreader 517 and first thermal interface material 518 to expose the through vias 5124. In some embodiments, the openings O are formed by mechanical drilling, such as laser drilling. However, the openings O may also be formed by another suitable process.

Referring to FIG. 6G, another carrier 511', similar to the carrier 511 (see FIG. 6F), is bonded to the top of the resulting structure of FIG. 6F (i.e., the heat spreader 517), and then the first carrier 511 is detached from the first package substrate 512. In some embodiments, a sacrificial layer (not shown) is formed between the first carrier 511 and the first package substrate 512. When the sacrificial layer is removed by any suitable etching or cutting process, the first carrier 511 can be detached from the first package substrate 512. Afterwards, a number of electrical connectors 519, such as BGA, may be formed on the first surface 512A of the first package substrate 512 (i.e., they are electrically connected to the conductive features 5122), in some embodiments as shown in FIG. 6G. The electrical connectors 519 may be configured to electrically connect the fabricated semiconductor package 500 (FIG. 5) to an external device (e.g., a PCB (not shown)). In some embodiments, the electrical connectors 519 comprise lead-free solder or the like.

Referring to FIG. 6H, the resulting structure of FIG. 6G is placed so that the electrical connectors 519 side is affixed to a dicing tape D1 or a die frame (not shown), and then the carrier 511' (FIG. 6G) is detached from the first heat spreader 517 by, for example the detaching process for the first carrier 511 described above. Afterwards, a singulation process (also referred to as a saw process) is performed. In the singulation process, the first heat spreader 517, first thermal interface material 518, molding compound 516, and first package substrate 512 are die cut or diced along cutting lines C (depicted by dashed lines) to separate the package of the first chip 513, first heat spreader 517, and first thermal interface material 518 into individual units. Each individual unit (i.e., a first package unit 510) includes the first heat spreader 517 attached to the first chip 513 by the first thermal interface material 518. The following describes the fabrication process of a second package unit 520.

Referring to FIG. 6I, a second carrier 521 is provided. A second package substrate 522 is formed on the second carrier 521. The second package substrate 522 may include one or more dielectric layers. Conductive redistribution lines 5221 (e.g., metal lines) may be formed in or between the dielectric layers to electrically couple a number of conductive features 5222 and 5223 (e.g., conductive pads) on opposite surfaces of the second package substrate 522. As shown in FIG. 6I, the second package substrate 522 has a first surface 522A (e.g., the bottom surface) attached to the second carrier 521 and a second surface 522B (e.g., the top surface) opposite to the first surface 522A. The conductive features 5223 exposed to the second surface 522B are configured to be electrically connected to second chips 523 (see FIG. 6J), and the conductive features 5222 exposed to the first surface 522A are configured to be electrically connected to the first package unit (see FIG. 5). In some embodiments, the second package substrate 522 also includes active and/or passive components (not shown). The materials, fabrication processes, and functions of the second carrier 521 and second package substrate 522 may be similar to those of the first carrier 511 and first package substrate 512 described above, and are not repeated here.

Referring FIG. 6J, a number of second chips 523 are mounted on the second package substrate 522 (only one second chip 523 is depicted for simplicity). The second chips 523 may be mounted on the second surface 522B (the top surface) of the second package substrate 522 (i.e., they are electrically connected to the conductive features 5223) by electrical connectors 524, such as a ball grid array (BGA). In some embodiments, the electrical connectors 524 comprise lead-free solder or the like. A reflow process (not shown) may be performed to make the metallurgical connections in a chip-solder-chip carrier (i.e., the second chip 523-the electrical connectors 524-the second package substrate 522). The second chips 523 may be any suitable integrated circuit (IC) chip or die for a particular application. For example, the second chips 523 may be memory chips, logic chips, processor chips, or the like. In various embodiments, the second chips 523 and the first chips 513 of the first package unit 510 are the same or different types of chips.

Referring to FIG. 6K, an underfill material 525 is dispensed (e.g., by a dispenser (not shown)) into the space between each second chip 523 and the second package substrate 522 and the space between adjacent electrical connectors 524, and then cured (e.g., ultraviolet (UV) or thermally cured) to harden. Afterwards, a molding compound 526 is formed over the second package substrate 522 and encapsulates the side periphery of each second chip 523, as shown in FIG. 6K. In some embodiments, the molding compound 526 is formed in such a way that its top surface 526A is substantially level (coplanar) with the top surface 523A of second chip 523 (i.e., the top surface 523A of second chip 523 is exposed as shown in FIG. 6K). The materials, fabrication processes, and functions of the underfill material 525 and molding compound 526 may be similar to those of the underfill material 515 and molding compound 516 described above, and are not repeated here.

Referring to FIG. 6L, a second heat spreader 527 and a second thermal interface material (TIM) 528 are provided, and the second thermal interface material 528 is dispensed (e.g., by a dispenser (not shown)) on the bottom surface 527A of the second heat spreader 527. The second heat spreader 527 may have high thermal conductivity. Furthermore, the second heat spreader 527 may be flexible. The materials and features of the second heat spreader 527 may be similar to those of the first heat spreader 517 described above, and are not repeated here. It should be understood that the thermal conductivity of the second heat spreader 527 may be different from the thermal conductivity of the first heat spreader 517 in some embodiments. For example, when the second chip 523 is a different type of chip than the first chip 513 and may generate different amounts of heat (e.g., higher than) with respect to the first chip 513, the used second heat spreader 527 may be chosen to have a higher thermal conductivity (than the first heat spreader 517) to facilitate heat dissipation, and vice versa. In some embodiments, the second heat spreader 527 and the first heat spreader 517 comprise different materials. For example, one of them may be a graphite sheet, and the other may be a graphite sheet with metal reinforcement.

The second thermal interface material 528 may be dispensed in a liquid form that has a high viscosity. The second thermal interface material 528 may have a higher thermal conductivity than a typical adhesive material, however, the thermal conductivity of the second thermal interface material 528 may still be much lower than that of the second heat spreader 527. The materials and features of the second thermal interface material 528 may be similar to those of the first thermal interface material 518 described above, and are not repeated here.

After the second thermal interface material 528 is applied to the bottom surface 527A of the second heat spreader 527, the second heat spreader 527 is attached to the second chip 523 and the molding compound 526 by the second thermal interface material 528. In the embodiments illustrated in FIG. 6L, after the second heat spreader 527 with the second thermal interface material 528 is placed over the second chip 523 and molding compound 526, an attachment process is performed. The attachment process includes rolling a rod R over the top surface 527B of the second heat spreader 527 (e.g., from one side (such as the left side in the figure) of the second heat spreader 527 to the opposite side (such as the right side in the figure) thereof) to attach the second heat spreader 527 to the second chip 523 and molding compound 526 through the second thermal interface material 528. By doing it this way, the flexible second heat spreader 527 (e.g., a graphite sheet) can be easily and smoothly attached to the top surface 523A of the second chip 523 and the top surface 526A of the molding compound 526.

Referring to FIG. 6M, a compression process and a curing process similar to those described above (see FIG. 6E) for the first heat spreader 517 and first thermal interface material 518 are performed. Once the compression and curing process is completed, the second heat spreader 527 and the underlying second thermal interface material 528 may uniformly cover the entire top surface 523A of the second chip 523 and the entire top surface 526A of the molding compound 526. Moreover, the entire second heat spreader 527 (over the second chip 523 and molding compound 526) has a uniform thickness T2.

Referring to FIG. 6N, another carrier 521', similar to the second carrier 521 (see FIG. 6M), is bonded to the top of the resulting structure of FIG. 6M (i.e., the second heat spreader 527), and then the second carrier 521 is detached from the second package substrate 522. In some embodiments, a sacrificial layer (not shown) is formed between the second carrier 521 and the second package substrate 522. When the sacrificial layer is removed by any suitable etching or cutting process, the second carrier 521 can be detached from the second package substrate 522. Afterwards, a number of electrical connectors 529, such as BGA, may be formed on the first surface 522A of the second package substrate 522 (i.e., they are electrically connected to the conductive features 5222), in some embodiments as shown in FIG. 6N. In some embodiments, the electrical connectors 529 comprise lead-free solder or the like.

Referring to FIG. 6O, the resulting structure of FIG. 6N is placed so that the electrical connectors 529 side is affixed to a dicing tape D2 or a die frame (not shown), and then the carrier 521' (FIG. 6N) is detached from the second heat spreader 527 by, for example the detaching process for the second carrier 521 described above. Afterwards, a singulation process (also referred to as a saw process) is performed. In the singulation process, the second heat spreader 527, second thermal interface material 528, molding compound 526, and second package substrate 522 are die cut or diced along cutting lines C (depicted by dashed lines) to separate the package of the second chip 523, second heat spreader 527, and second thermal interface material 528 into individual units. Each individual unit (i.e., a second package unit 520) includes the second heat spreader 527 attached to the second chip 523 by the second thermal interface material 528.

Referring to FIG. 6P, the fabricated second package unit 520 is removed from the dicing tap D2 (FIG. 6O) by a suction unit U (e.g., a vacuum suction unit), and then placed so that the electrical connectors 529 on the second package substrate 522 are aligned with, and electrically connected to, the through vias 5124 of the first package unit 510 (the electrical connectors 529 may pass through the openings O (FIG. 6H) of the first heat spreader 517 and the first thermal interface material 518 to connect to the through vias 5124) while the first package unit 510 is affixed to the dicing tape D1. A reflow process (not shown) may be performed to make the metallurgical connections in a chip package-solder-chip package (i.e., the second package unit 520-the electrical connectors 529-the first package unit 510). After removing the dicing tape D1, the fabrication of the semiconductor package 500 (FIG. 5) including multiple stacking package units is completed.

As shown in FIG. 5, with the first heat spreader 517 attached on top of the first chip 513, it provides a thermal path (as indicated by the arrows in the figure) through which heat that is generated by the first chip 513 is dissipated to the surrounding environment to prevent chip overheating. Similarly, the second heat spreader 527 attached on top of the second chip 523 also provides a thermal path (as indicated by the arrows in the figure) through which heat that is generated by the second chip 523 is dissipated to the surrounding environment to prevent chip overheating. It should be appreciated that the heat spreader (517 or 527) utilizing a graphite sheet may provide a high degree of heat dissipation, especially in the horizontal direction, thereby avoiding overheating of the chip (i.e., the heat generated by the chip can be dissipated or removed rapidly). Moreover, the semiconductor package 500 can also have a small thickness T due to the thin heat spreaders 517 and 527.

The embodiments of the present disclosure have some advantageous features: The heat spreader attached on top of the chip can facilitate heat dissipation, thereby preventing chip overheating. In some embodiments, the heat spreader utilizing a graphite sheet may provide a high degree of heat dissipation, especially in the horizontal direction. Compared with heat dissipation in the vertical direction (e.g., through a heat sink placed on the backside of the semiconductor package), heat dissipation in the horizontal direction may accelerate the elimination or dissipation of overheating energy in the chip so that the hot spot issue can be resolved. Furthermore, the heat spreader utilizing a graphite sheet may have a relatively smaller thickness (than typical metal heat spreader), thereby reducing the thickness of the semiconductor package. Moreover, the heat spreader can protect the chip from being easily damaged due to direct contact with a heavy heat sink or another rigid object. Accordingly, the thermal and mechanical performance of the semiconductor package using the heat spreader are also improved. In addition, an attachment process using a rod to roll over the top surface of the flexible heat spreader is also provided to allow the heat spreader to be easily and smoothly attached on top of the chip.

In some embodiments, a method of forming a semiconductor package is provided. The method includes mounting a chip on a package substrate. The method further includes placing a heat spreader over the chip and applying a thermal interface material to a first surface of the heat spreader facing the chip. The heat spreader is flexible. In addition, the method includes attaching the heat spreader to the chip through the thermal interface material by rolling a rod over a second surface of the heat spreader, the second surface being opposite to the first surface.

In some embodiments, a method of forming a semiconductor package is provided. The method includes forming a conductive structure over a first package substrate, bonding a first chip on the first package substrate, forming a molding compound surrounding the conductive structure and the first chip, forming a first heat spreader and a first thermal interface material over the conductive structure, the first chip, and the molding compound, wherein the heat spreader is flexible, and forming an opening on the first heat spreader and the first thermal interface material to expose the conductive structure.

In some embodiments, a method of forming a semiconductor package is provided. The method includes providing a package substrate on a first carrier, bonding a first chip on the package substrate, forming a molding compound surrounding the first chip, forming a heat spreader and a thermal interface material over the first chip and the molding compound, bonding the heat spreader on a second carrier, and forming an electrical connector on the package substrate. The heat spreader is flexible. The electrical connector and the first chip are disposed on opposite sides of the package substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a semiconductor package, comprising:
   mounting a chip on a package substrate;
   placing a heat spreader over the chip and applying a thermal interface material to a first surface of the heat spreader facing the chip, wherein the heat spreader is flexible;

attaching the heat spreader to the chip through the thermal interface material by rolling a rod over a second surface of the heat spreader, the second surface being opposite to the first surface;

mounting a second chip on the package substrate; and dispensing a underfill material between the package substrate and the chip, and between the package substrate and the second chip, wherein the underfill material continuously extends under the chip and the second chip.

2. The method as claimed in claim 1, further comprising performing a compression and curing process to cure the thermal interface material.

3. The method as claimed in claim 1, further comprising:

dispensing a underfill material into a space between the chip and the package substrate; and forming a molding compound over the package substrate so that the molding compound encapsulates a side periphery of the chip and exposes a top surface of the chip; wherein the attachment process further comprises attaching the heat spreader to the top surface of the chip and a top surface of the molding compound through the thermal interface material.

4. The method as claimed in claim 3, further comprising:

forming a metal feature in the molding compound before the attachment process; and performing a drilling process to form an opening in the heat spreader and the thermal interface material to expose the metal feature.

5. The method as claimed in claim 1, wherein the chip and the second chip have different heights.

6. The method as claimed in claim 1, further comprising providing a metal heat sink over a top surface of the chip and a top surface of the second chip, wherein a distance between the metal heat sink and the chip is different from a distance between the metal heat sink and the second chip.

7. The method as claimed in claim 1, wherein the first chip and the second chip have different heights.

8. A method of forming a semiconductor package, comprising:

providing a package substrate on a first carrier;

bonding a first chip on the package substrate;

forming a molding compound surrounding the first chip;

forming a heat spreader and a thermal interface material over the first chip and the molding compound by rolling a rod over the heat spreader, wherein the heat spreader is flexible;

bonding the heat spreader on a second carrier; and forming an electrical connector on the package substrate, wherein the electrical connector and the first chip are disposed on opposite sides of the package substrate.

9. The method as claimed in claim 8, further comprising:

affixing the electrical connector on a dicing tape;

removing the first carrier;

dicing the package substrate; and removing the dicing tape.

10. The method as claimed in claim 8, further comprising bonding a second chip on the package substrate, wherein the heat spreader and the thermal interface material continuously extend above the first chip and the second chip.

11. The method as claimed in claim 10, wherein the first chip and the second chip have different heights, and the method further comprises providing a heat sink over the heat spreader, wherein the heat sink has a bottom surface that conforms a profile of a top surface of the first chip and a top surface of the second chip.

12. The method as claimed in claim 11, wherein the heat spreader and the heat sink have different heat conductivities.

13. The method as claimed in claim 10, further comprising forming a underfill layer extending under the first chip and the second chip, wherein a portion of the molding compound is between the first chip and the second chip and in contact with the underfill layer.

14. The method as claimed in claim 8, further comprising forming an opening on the heat spreader.

15. A method of forming a semiconductor package, comprising:

forming a conductive structure over a first package substrate;

bonding a first chip on the first package substrate;

forming a molding compound surrounding the conductive structure and the first chip;

forming a first heat spreader and a first thermal interface material over the conductive structure, the first chip, and the molding compound by rolling a rod over the first heat spreader, wherein the first heat spreader is flexible; and forming an opening on the first heat spreader and the first thermal interface material to expose the conductive structure.

16. The method as claimed in claim 15, further comprising:

bonding a second chip on a first side of a second package substrate;

forming a second heat spreader and a second thermal interface material over the second chip;

bonding an electrical connector on a second side of the second package substrate, wherein the first side is opposite to the second side; and connecting the electrical connector to the conductive structure through the opening.

17. The method as claimed in claim 16, further comprising:

forming a first underfill layer between the first chip and the first package substrate; and forming a second underfill layer between the second chip and the second package substrate, wherein the first chip is disposed between the first underfill layer and the second underfill layer.

18. The method as claimed in claim 16, wherein a top surface of the first chip faces the first heat spreader and the second heat spreader.

19. The method as claimed in claim 16, wherein a gap is formed between the second package substrate and the first heat spreader.

20. The method as claimed in claim 15, wherein the opening has a tilted side surface.

* * * * *